United States Patent
Appuswamy et al.

(10) Patent No.: US 10,621,489 B2
(45) Date of Patent: Apr. 14, 2020

(54) MASSIVELY PARALLEL NEURAL INFERENCE COMPUTING ELEMENTS

(71) Applicant: INTERNATIONAL BUSINESS MACHINES CORPORATION, Armonk, NY (US)

(72) Inventors: Rathinakumar Appuswamy, San Jose, CA (US); John V. Arthur, Mountain View, CA (US); Andrew S. Cassidy, San Jose, CA (US); Pallab Datta, San Jose, CA (US); Steven K. Esser, San Jose, CA (US); Myron D. Flickner, San Jose, CA (US); Jennifer Klamo, San Jose, CA (US); Dharmendra S. Modha, San Jose, CA (US); Hartmut Penner, San Jose, CA (US); Jun Sawada, Austin, TX (US); Brian Taba, Cupertino, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 28 days.

(21) Appl. No.: 15/942,289

(22) Filed: Mar. 30, 2018

(65) Prior Publication Data
US 2019/0303749 A1    Oct. 3, 2019

(51) Int. Cl.
*G06N 3/063* (2006.01)
*G06F 17/16* (2006.01)
(Continued)

(52) U.S. Cl.
CPC ............ *G06N 3/063* (2013.01); *G06F 5/01* (2013.01); *G06F 7/505* (2013.01); *G06F 7/53* (2013.01); *G06F 17/16* (2013.01); *H03M 7/30* (2013.01)

(58) Field of Classification Search
CPC ........ G06N 3/063; G06N 3/04; G06N 3/0445; G06N 3/0481; G06F 7/50–5095; G06F 7/523–5336; G06F 17/16
See application file for complete search history.

(56) References Cited

U.S. PATENT DOCUMENTS

| | | |
|---|---|---|
| 5,887,078 A | 3/1999 | Kwon et al. |
| 7,870,180 B2 | 1/2011 | Mohamed et al. |

(Continued)

FOREIGN PATENT DOCUMENTS

| | | |
|---|---|---|
| CN | 106355246 A | 1/2017 |
| CN | 106682732 A | 5/2017 |
| WO | 2016/174113 A1 | 11/2013 |

OTHER PUBLICATIONS

Y. Chen et al., DaDianNao: A Machine-Learning Supercomputer, 2014 47th IEEE/ACM International Symposium on Microarchitecture, 2014 (Year: 2014).*

(Continued)

*Primary Examiner* — Andrew Caldwell
*Assistant Examiner* — Emily E Larocque
(74) *Attorney, Agent, or Firm* — Erik Huestis; Stephen Kenny; Foley Hoag LLP

(57) ABSTRACT

Massively parallel neural inference computing elements are provided. A plurality of multipliers is arranged in a plurality of equal-sized groups. Each of the plurality of multipliers is adapted to, in parallel, apply a weight to an input activation to generate an output. A plurality of adders is operatively coupled to one of the groups of multipliers. Each of the plurality of adders is adapted to, in parallel, add the outputs of the multipliers within its associated group to generate a partial sum. A plurality of function blocks is operatively coupled to one of the plurality of adders. Each of the plurality of function blocks is adapted to, in parallel, apply a function to the partial sum of its associated adder to generate an output value.

33 Claims, 21 Drawing Sheets

(51) Int. Cl.
  *G06F 7/53*    (2006.01)
  *G06F 7/505*   (2006.01)
  *G06F 5/01*    (2006.01)
  *H03M 7/30*    (2006.01)

(56) References Cited

U.S. PATENT DOCUMENTS

| | | | |
|---|---|---|---|
| 9,646,243 | B1 | 5/2017 | Gokmen |
| 9,697,463 | B2 | 7/2017 | Ross et al. |
| 9,721,203 | B1 | 8/2017 | Young et al. |
| 9,747,546 | B2 | 8/2017 | Ross et al. |
| 2017/0011288 | A1* | 1/2017 | Brothers ............... G06N 3/063 |
| 2018/0089562 | A1* | 3/2018 | Jin ...................... G06F 7/5443 |
| 2018/0157465 | A1* | 6/2018 | Bittner ................. G06F 7/483 |
| 2018/0246855 | A1* | 8/2018 | Redfern ................ G06F 17/16 |
| 2018/0260690 | A1* | 9/2018 | Young .................. G06F 7/78 |
| 2018/0307950 | A1* | 10/2018 | Nealis ................. G06K 9/66 |
| 2019/0050717 | A1* | 2/2019 | Temam ................. G06F 13/00 |
| 2019/0138567 | A1* | 5/2019 | Martin ................. G06N 3/063 |

OTHER PUBLICATIONS

F. Grun, What is the transfer function in Artificial Neural Networks, https://www.quora.com/What-is-the-transfer-function-in-Artificial-Neural-Networks, 2016 (Year: 2016).*

Tianshi Chen et al., DianNao: A Small-Footprint High-Throughput Accelerator for Ubiquitous Machine-Learning, ASPLOS '14, 2014, (Year: 2014).* of N. Jouppi, et al, In-Datacenter Performance Analysis of a Tensor Processing Unit, Proceedings of ISCA '17, 2017 (Year: 2017).*

H. Alemdar et al., Ternary Neural Networks for Resource-Efficient AI Applications, arXiv:1609.00222v2 [cs.LG], 2017 (Year: 2017).*

M.T. Tommiska, Efficient digital implementation of the sigmoid function for reprogrammable logic, IEE Proc.-Comput. Digit Tech., vol. 150, No. 6, 2003 (Year: 2013).*

Z. Li et al, A survey of neural network accelerators, Front. Comput. Sci., 2017, p. 746-761 (Year: 2017).*

V. Sze, et al., Efficient Processing of Neural Networks: A Tutorial and Survey, Proceedings of the IEEE, vol. 105, No. 12, 2017, p. 2295-2329 (Year: 2017).*

Fox, "Massively Parallel Neural Computation," University of Cambridge Computer Laboratory, 2013.

Anonymous, "Efficient Accelerators for Matrix Multiplication in Machine Learning," 2015.

Zoeter, "A new approximate inference method for the spike and slab model: expectation propagation with a replication trick," 2012.

Anonymous, "A system and method for computational analysis of mutational hotspots in the human genome," 2008.

Anonymous, "Machine Learning Algorithms for Smart Meter Diagnostics," 2015.

International Search Report and Written Opinion for International Application No. PCT/IB2019/051959 dated Jul. 3, 2019.

* cited by examiner

Ternary Multiplier Using Multiplexor

Optimization of Ternary Multiplier

MASSIVELY PARALLEL NEURAL INFERENCE COMPUTING ELEMENTS

BACKGROUND

Embodiments of the present disclosure relate to neural network inferencing, and more specifically, to massively parallel neural inference computing elements.

BRIEF SUMMARY

According to embodiments of the present disclosure, systems for, methods of, and computer program products for massively parallel neural inference computing are provided. A plurality of multipliers is arranged in a plurality of equal-sized groups. Each of the plurality of multipliers is adapted to, in parallel, apply a weight to an input activation to generate an output. A plurality of adders is operatively coupled to one of the groups of multipliers. Each of the plurality of adders is adapted to, in parallel, add the outputs of the multipliers within its associated group to generate a partial sum. A plurality of function blocks is operatively coupled to one of the plurality of adders. Each of the plurality of function blocks is adapted to, in parallel, apply a function to the partial sum of its associated adder to generate an output value.

DETAILED DESCRIPTION

Figure 1:
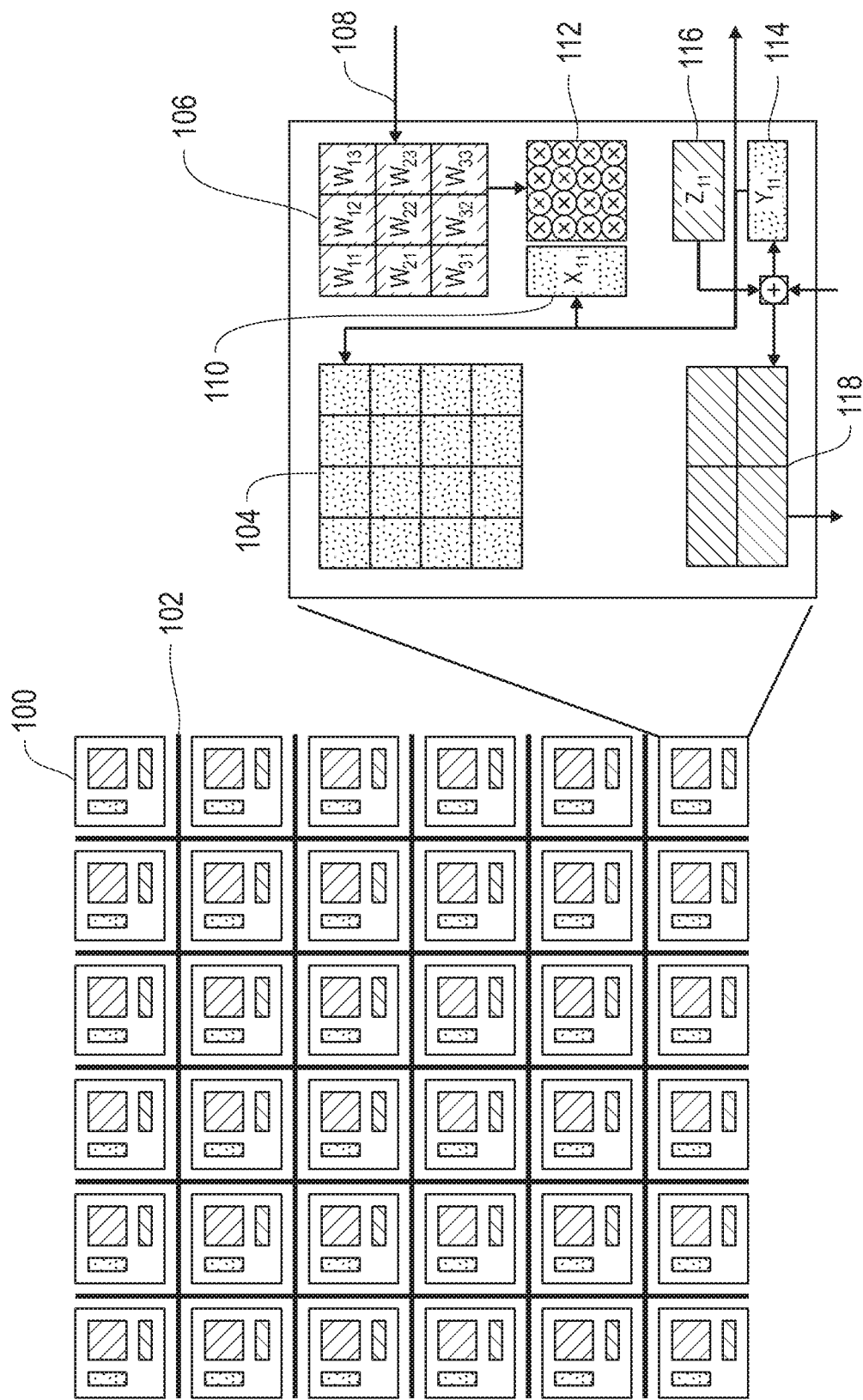
FIG. 1 depicts a plural neural core inference processor architecture, according to embodiments of the present disclosure.

An artificial neuron is a mathematical function whose output is a nonlinear function of a linear combination of its inputs. Two neurons are connected if the output of one is an input to the other. A weight is a scalar value encoding the strength of the connection between the output of one neuron and the input of another neuron.

A neuron computes its output, called an activation, by applying a nonlinear activation function to a weighted sum of its inputs. A weighted sum is an intermediate result computed by multiplying each input with the corresponding weight and accumulating the products. A partial sum is a weighted sum of a subset of inputs. A weighted sum of all inputs may be computed in stages by accumulating one or more partial sums.

A neural network is a collection of one or more neurons. A neural network is often divided into groups of neurons called layers. A layer is a collection of one or more neurons that all receive input from the same layers and all send output to the same layers, and typically perform a similar function. An input layer is a layer that receives input from a source outside the neural network. An output layer is a layer that sends output to a target outside the neural network. All other layers are intermediate processing layers. A multilayer neural network is a neural network with more than one layer. A deep neural network is a multilayer neural network with many layers.

Arrays of neural processing units, called neural cores, provide an architecture to execute various types of neural networks and deep neural networks. A variety of core architectures are suitable for implementing neural network computations. In general, such computations involve computing neuron activations based on input values, synaptic weights, and neural activation functions. It will be appreciated that neuron activations may be distributed in various ways, including via an on-chip network. Various examples herein refer to neuron activations transmitted over a network, however, it will be appreciated that the present disclosure applies more generally to any neurosynaptic systems, including GPUs and specialized ASIC chips, and to neuron activations irrespective of transport mechanism.

According to various embodiments of the present disclosure, a neural program represents a neural network. A neural program includes information relating to the neural network. In some embodiments, the information includes neuronal properties and dynamics that determine an electronic neuron's response to input neuron activations. For example, neuronal properties and dynamics can include a threshold parameter, a leak parameter, a delay parameter, or a reset parameter. In some embodiments, the neural program information includes synaptic connections of the neuron (e.g., synaptic connections made via a synaptic weight matrix). In some embodiments, the neural program information includes axon properties (e.g., axon types). In some embodiments, the neural program information includes one or more destinations (e.g., target axons) that the neuron's output activation should be delivered to.

According to various embodiments, a neural network represents an instantiation of a neural program. A neural network may be instantiated in hardware, in simulation or in both. For example, a neural program may give rise to one or more instances of a neural network, wherein the instances may reside on a single core, multiple cores, or multiple chips.

In accordance with an aspect of the present disclosure, a dendritic tree is provided, which can be configured in a dedicated orientation to multiply-accumulate circuits for every synapse, and in some instances operate in parallel. Additionally, the present disclosure provides dedicated partial sum operators and nonlinear activation circuits for every neuron, which can likewise operate in parallel. In some embodiments, a multifunction circuit is employed for adder or max/min operations. In some embodiments the system includes a pipelined dendritic tree.

In accordance with an aspect of the present disclosure, a neuron activation function is included which, in some embodiments, employs a lookup table to represent a neuron activation function. This feature is advantageous in that it enables efficient and reconfigurable implementations of discretized models of continuous nonlinearities like sigmoid, tan h, ReLU, etc. In some embodiments, the system distributes activations to all the parallel neuron circuits in a core using, e.g., a broadcast network or systolic distribution. Furthermore, the present disclosure includes a circuit for efficient ternary vector-matrix multiplication. In some embodiments, m-entry n-bit vector multiplication is performed with m-entry ternary multipliers and accumulator circuits. In some embodiments, m-entry n-bit vector multiplication is performed directly with m-entry ternary compressed vector (e.g. 8 bits for κ weights) with accumulate circuit.

With reference now to FIG. 1, a baseline many-core neural inference processor architecture according to embodiments of the present disclosure is depicted. In some embodiments, neural core 100 receives a vector of neural activations as axonal inputs and multiplies the input activations with a matrix representing synaptic weights to produces a vector of neural activations as an output. In some embodiments, input and output activations are provided as 32-element vectors. In such embodiments, the synaptic weights are represented by a 32×32 matrix with 1,024 weight elements. In various embodiments, the weights are binary, trinary (−1, 0, 1), or small integers. In some embodiments a plurality of neural cores are tiled on a chip, as shown in FIG. 1.

In aggregate, the plurality of neural inference cores 100 are connected by a Network on Chip (NoC) 102. As shown in the call-out in FIG. 1, each neural inference core 100 includes an activation memory 104, weight memory 106, broadcast bus 108, input activation register 110, massively parallel vector-matrix multiplier 112, output activation register 114, partial sum scratch pad 116, and routing buffer 118.

In an exemplary implementation, the baseline core behaves according to the following protocol:
1. At initialization, input activations are stored in the core activation memories.
2. Weight values are distributed to each core through Network on Chip (NoC) 102, and stored in the weight memory 106.
3. Activation block X is read from activation memory 104, weight block W is read from weight memory 106, and sent to the vector-matrix multiplier.
4. The vector-matrix multipliercomputes vector-matrix product XW and the output Z is stored in the partial sum register 116.
5. The partial sums may be sent to or received from neighboring cores through routing buffer 118, and then added to other partial matrix multiplication results X' W'=Z'.
6. An activation function is applied to the final partial sum and the result Y is written to the output activation register 114.
7. The output activation Y is written back to the activation memory 104.

In this way, various core configurations provide distributed logic for computation. In various embodiments, multiple distributed neural cores act in parallel. This parallelism enables an increase in the speed of neural network processing while decreasing latency between presentation of input and computation of output. Each neural core implements a part of the larger neural network model for a given problem. Each neural core receives a portion of the overall chip input, and a portion of the overall neural network model. This enables modularity of chips and cores, thereby streamlining system design, debugging, and testing.

It will be understood by one of ordinary skill that the particular core implementation disclosed herein is for purpose of illustration and not limitation, a variety of core implementations can be incorporated within the present disclosure.

In an exemplary implementation, the following neural network computation is performed for each neuron j, with input activation $x_i$ and weight $w_{ij}$, the partial sum $Z_j$ can be computed by:

$$Z_j = \Sigma_i x_i w_{ij}$$

The output activation is then computed from partial sum z for each output neuron j $$y_j = f(z_j)$$

where $f(z)$ is a non-linear activation function.

For $f(z)$, a sigmoid function, tan h(x), or a simpler linear rectifier function can be used.

Neural accelerators, including but not limited to GPUs and ASICs, may perform a distributed multiply-add operation over several multiply-accumulate (MAC) units. However, such architectures have an inherent sequential nature in performing a series of multiply-add operations, which limits the degree of parallelism, even though the underlying neural network is fundamentally a parallel computation that allows massive parallelism. Accordingly, an objective of the present disclosure is to provide a low precision neural network, wherein the hardware is able to do substantially more (e.g. orders of magnitude) computation in parallel. In particular, the present disclosure provides massively parallel computing elements that include multiple multiply-add operations for computing neurons in parallel.

Figure 2:
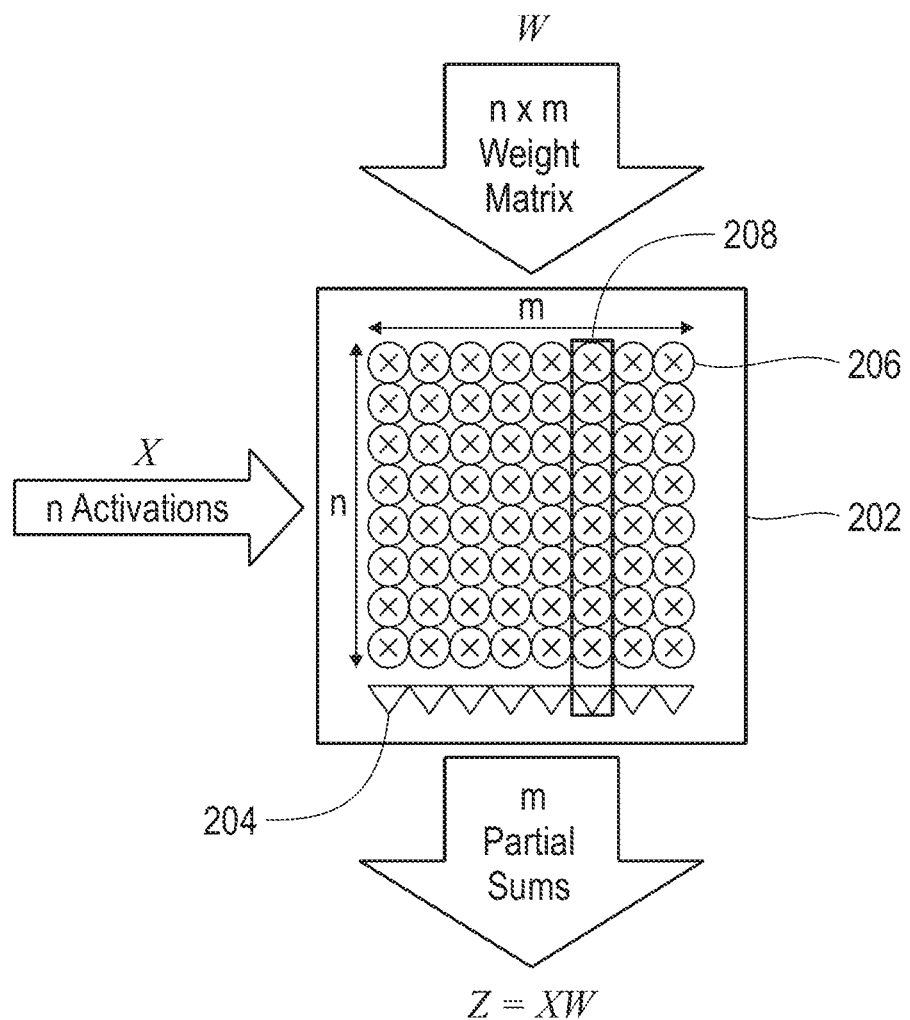
FIG. 2 depicts a massively parallel vector matrix multiplier for calculating partial sums, according to embodiments of the present disclosure.

With reference now to FIG. 2, an exemplary massively parallel computing element for calculating neuron activations is disclosed. The exemplary embodiment includes a massively parallel vector matrix multiply unit for a neural inference processor with low precision neurons. A plurality of adder trees 204 are provided in the compute unit 202 (each adder tree able to sum n outputs from n multipliers). An individual multiplier is depicted at 206, with a single column 208 of a VMM is a dendrite tree depicted (and described in further detail with respect to FIG. 3).

The system receives X, an n-element input activation row vector (in some embodiments, each element is 4 bit, with n=32). Additionally, the system receives W, an n×m weight matrix (in some embodiments, each element is 2-bit and n=m=32). The compute unit 202 has n×m multipliers, and adders to combine products. They compute all multiplications in parallel and add up the results in parallel (however, the exact location of multiplier can vary and is not restricted to the particular array depicted). In some embodiments, there are 32×32=1024 small multipliers. The result Z=XW is a vector matrix product with m-elements. In an exemplary embodiment, m=32, but each of the m-elements is 10 bits.

Figure 3:
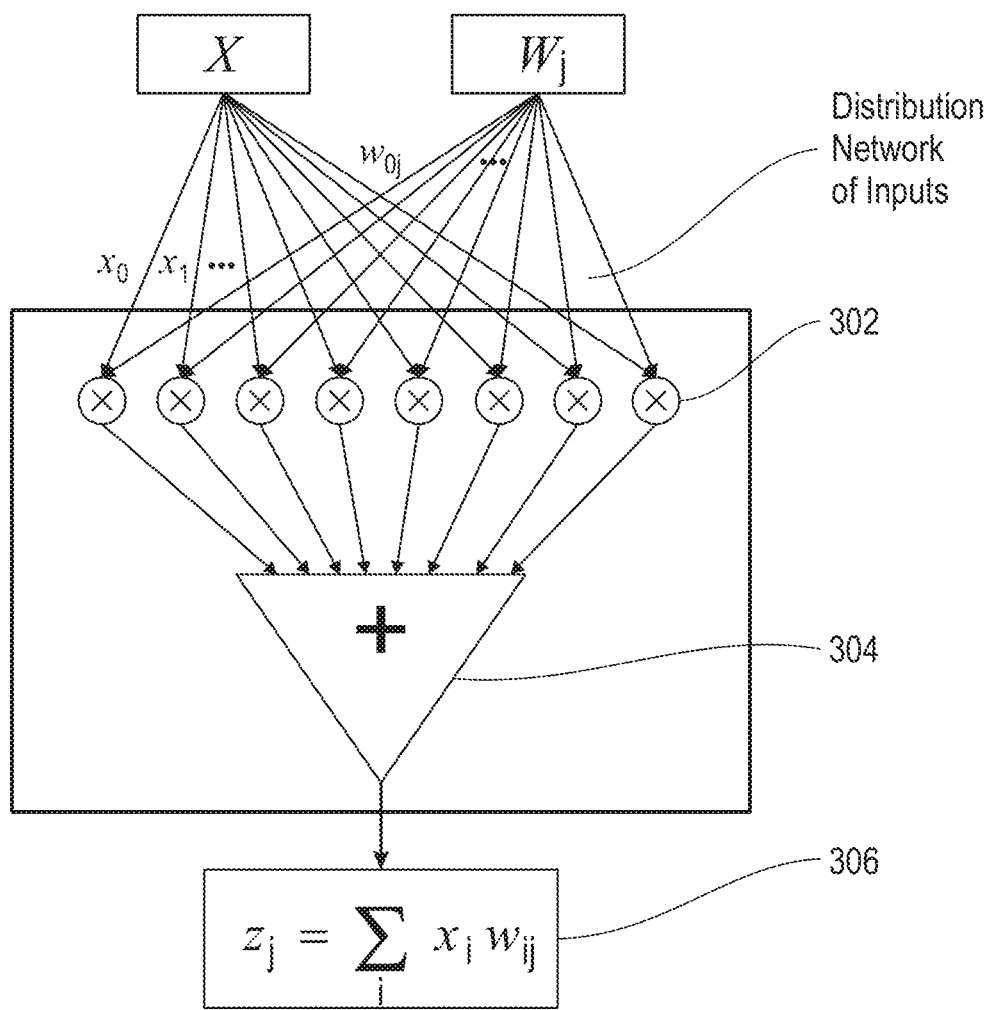
FIG. 3 depicts a dendrite circuit, according to embodiments of the present disclosure.

The output element of the vector matrix multiply unit of FIG. 2 can be computed by n-parallel multipliers followed by an adder tree, as depicted in FIG. 3. Particularly, the inputs, n-element vector X and $W_j$ ($j^{th}$ column of matrix W), are distributed to n-way parallel multipliers 302, which can be configured in a parallel orientation. Each multiplier computes a product, with the products being added into a single sum by the adder tree 304. The output of the adder tree is the partial sum 306, which may be used for calculating the neuron activation. As set out further below, this partial sum may be provided to an activation function, which in some embodiments is programmable and can be set to a non-linear or linear function, e.g., the identity function.

In the exemplary embodiment of FIG. 3, n multipliers and an adder tree are provided. Additionally, input n-element row vector X and $W_j$ ($j^{th}$ column of matrix W) are distributed to n multipliers; each multiplier computes a product; products are added into a single sum by the adder tree; and output $Z_j=\Sigma_i x_i w_{ij}$ represents the $j^{th}$ vector element of Z=XW. In some embodiments, the multipliers are 4×2 bit multipliers, and the adder tree sums the outputs from n=32 multipliers, with the final output being 10 bits. In other embodiments, the multiplication and addition operations are performed using carry-save adders, such that the final output consists of two vectors (sum vector and carry vector). The final answer Z is the addition of the sum and carry vectors. The final addition of the sum and carry vectors may occur inside the dendrite tree, or may be performed by a subsequent processing stage, outside the dendrite tree.

Figure 4:
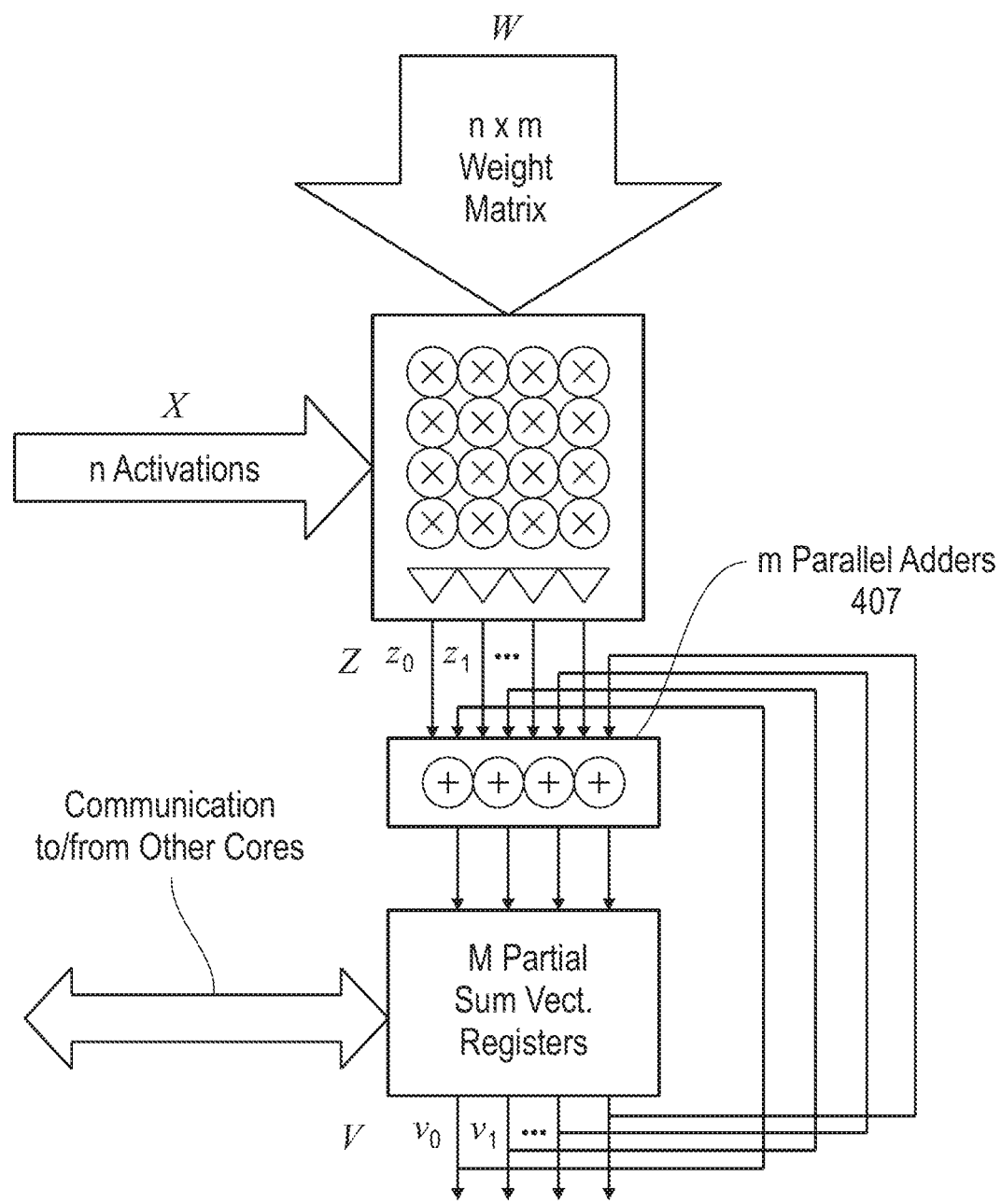
FIG. 4 depicts a vector-matrix multiplier with an array of adders and a vector register, according to embodiments of the present disclosure.

In connection with the operation shown schematically in FIG. 4, an exemplary embodiment in which the vector-matrix multiplier result is added to a previously computed (partial sum) result, in accordance with the present disclosure. In such embodiments, the output result of the vector matrix multiply unit (called a partial sum vector) can be added to a previously computed partial sum vector. As shown in FIG. 4, a partial sum register can store partial sum vectors of m-elements, and m parallel adders to add the new partial sums (Z) and previously computed ones ($V^{t-1}$). Also, previously computed partial sums ($V^{t-1}$) may come from other cores by means of a core-to-core communication channel. In the illustrated embodiment, partial sum vector addition takes place in parallel with m parallel adders 407.

Additionally, a further optimization can be realized when the output from the vector-matrix multiplier is represented by two sets of vectors (sum vector and carry vector). Then m-parallel adders may be implemented using carry save adders (similar to a floating-point multiply-adder.)

Figure 5:
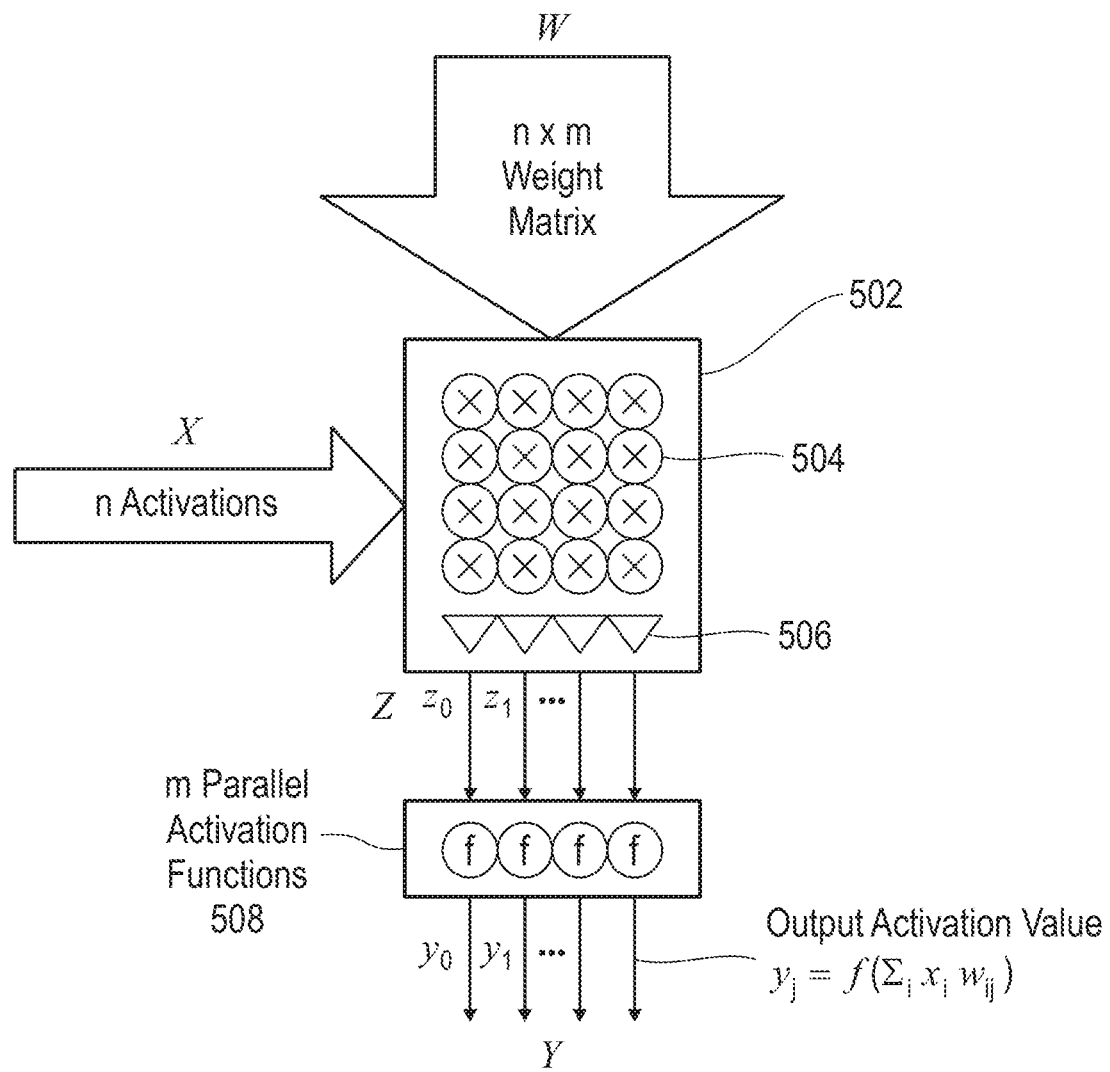
FIG. 5 depicts a vector-matrix multiplier with an activation function, according to embodiments of the present disclosure.

As shown in FIG. 5, an activation function array is disclosed in which each output element from the vector-matrix unit is $Z_j=\Sigma_i x_i w_{ij}$. An activation function $f$ can be applied to get the neuron activation: $Y_j=f(\Sigma_i x_i w_{ij})$. Exemplary activation functions include the binary threshold function, sigmoid function, ReLU (Rectified Linear Unit), and linear function, as well as arbitrary non-linear functions possible using a look-up table (LUT). Next, an array of m activation function calculators are implemented, coupled to the output of the vector-matrix unit. This produces m activation values each of which can be represented as: $y_j=f(\Sigma_i x_i w_{ij})$. In order to simplify architectural design, the output of the activation function (Y) can have the same precision as the input activations (X). In some embodiments, both input and output activations are 4-bit. The activation function calculators can be used to reduce the precision of the vectors. Partial sum vectors (Z) are generally of higher precision (10-bits), while output activation vectors (Y) are of low precision (4-bits). A variety of linear and non-linear functions can accomplish this reduction of precision. Also in an exemplary embodiment m=n=32, so the input and output activation vectors are the same length. Accordingly, the output activation vector (Y) can be immediately used as an input activation vector (X).

A typical neuron activation takes an n-element vector X, n×m weight matrix W, calculates $Y_j=f(\Sigma_i x_i w_{ij})$, and produces an m-element output vector Y, as shown. The $Z_j=\Sigma_i x_i w_{ij}$ part is computed by a vector matrix multiplier 502 which consists of arrays of multipliers 504 and arrays of adder trees 506. Activation functions 508 are applied in parallel to the output from the vector matrix multiply. In some embodiments, n=m=32 or n=m=64; which renders the input and output size identical.

Figure 6:
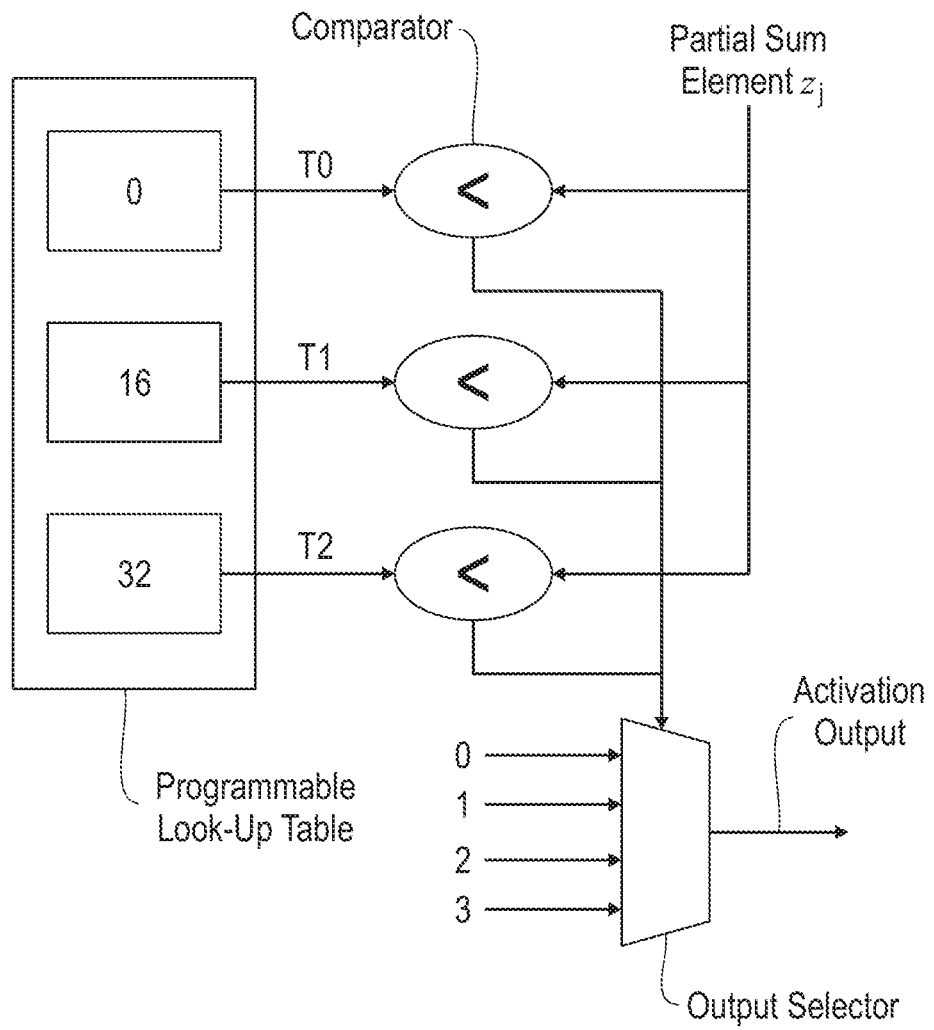
FIG. 6 depicts a lookup table for an activation function, according to embodiments of the present disclosure.

In connection with the operation shown schematically in FIG. 6, an exemplary embodiment in which a programmable non-linear monotonic activation function is implemented by a table lookup. In this exemplary embodiment, programmable table entries T0, T1, T2 . . . specify the partial sum PS range for specific output values:

$z_j$<T0 then f=0
T0<$z_j$<T1 then f=1
T1<$z_j$<T2 then f=2 etc.

In the implementation depicted in FIG. 6, the programmable look-up table contains T0, T1, T2, . . . an array of comparators compares table entries with partial sum element $z_j$. Selector logic picks the function value output depending on the comparater results. It will be appreciated that the configuration of FIG. 6 may be applied to any sized lookup table.

A comparison of only high-order bits or only low-order bits can be performed to reduce the logic size. This works as the output activation has limited precision (e.g., has 4 bits, and the look-up table needs only 15 entries). This can implement arbitrary non-linear functions such as sigmoid function without a complex arithmetic computation unit.

In accordance with another aspect of the disclosure, vector-matrix multiply is pipelined, and also the combined circuit with the activation function circuit is pipelined. Pipelining can be performed to increase clock frequency and the performance of the logic circuits. As the vector-matrix multiply circuit is relatively large circuits, it is a well suited target to be pipelined.

Figure 7A:
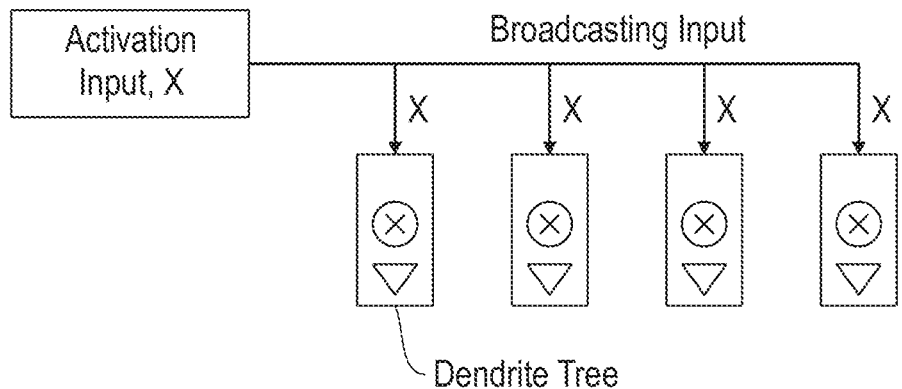
FIGS. 7A-B depict input activation via distribution broadcasting, according to embodiments of the present disclosure.
Figure 7B:
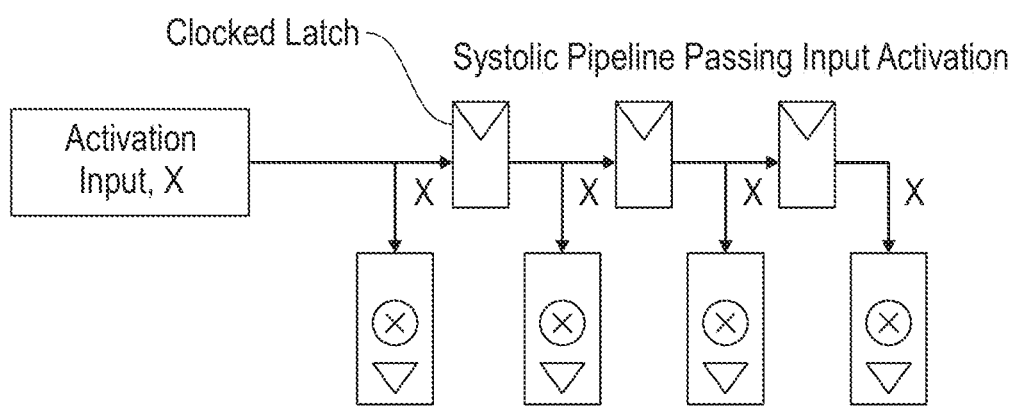

FIGS. 7A-B depict exemplary embodiments in which distribution of input activation is achieved by broadcasting, or by a systolic pipeline, in accordance with the present disclosure. The vector-matrix multiply unit, which consists of m dendrite trees, which are medium size circuits, can be optimized regarding how to broadcast inputs. Additionally, passing input activations can be achieved by broadcasting. In some embodiments, all dendrite trees start computing together, and all output results are produced at the same time. Additionally or alternatively, passing input activations can be done by a systolic pipeline. For example, activation input can be passed from one latch to another every clock cycle and delivered to the dendrite trees at a different clock cycle. Some delay may be incurred in such scenarios, however throughput can be improved by providing a faster clock frequency.

Figure 8:
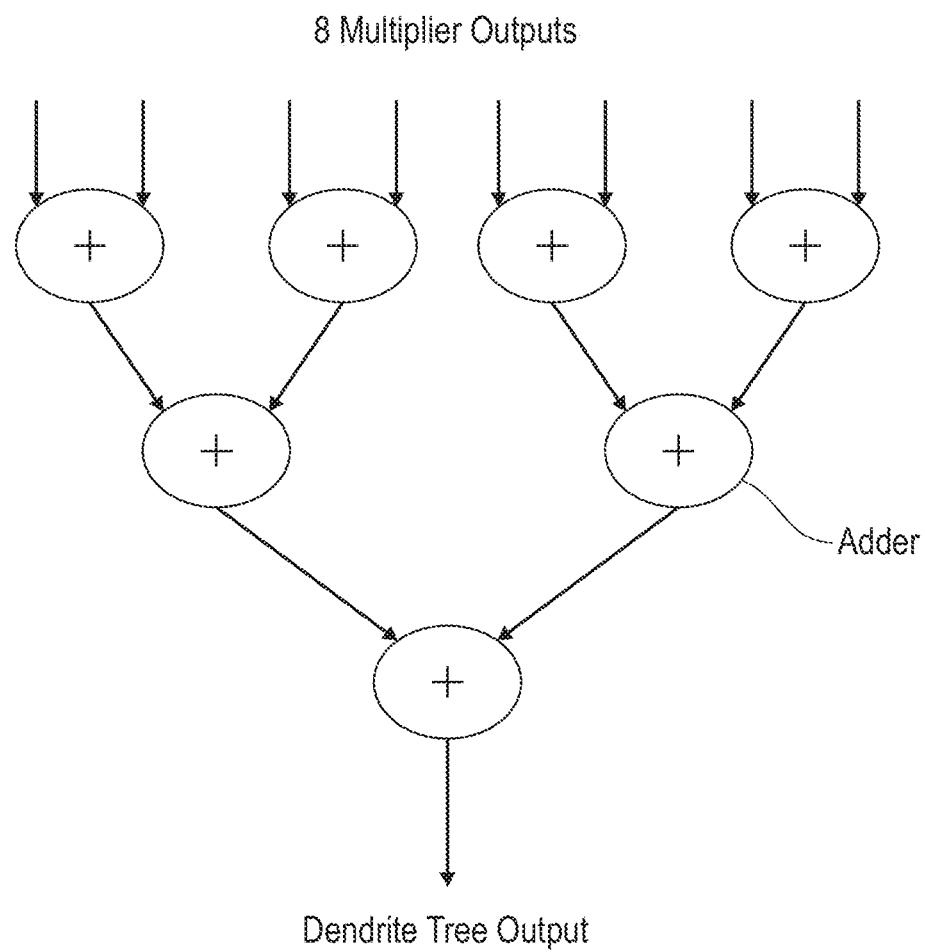
FIG. 8 depicts binary trees of adders for a dendrite circuit, according to embodiments of the present disclosure.

In connection with the operation shown schematically in FIG. 8, an exemplary embodiment in which an adder tree is a configured as a binary tree of adders is presented. In accordance with the present disclosure, an adder tree can be implemented in various ways. One exemplary implementation of an adder tree is using a binary tree. This is advantageous in that current circuit synthesis tools can be used to generate well-optimized circuits. For a low precision adder tree, this approach provides sufficient results.

Figure 9:
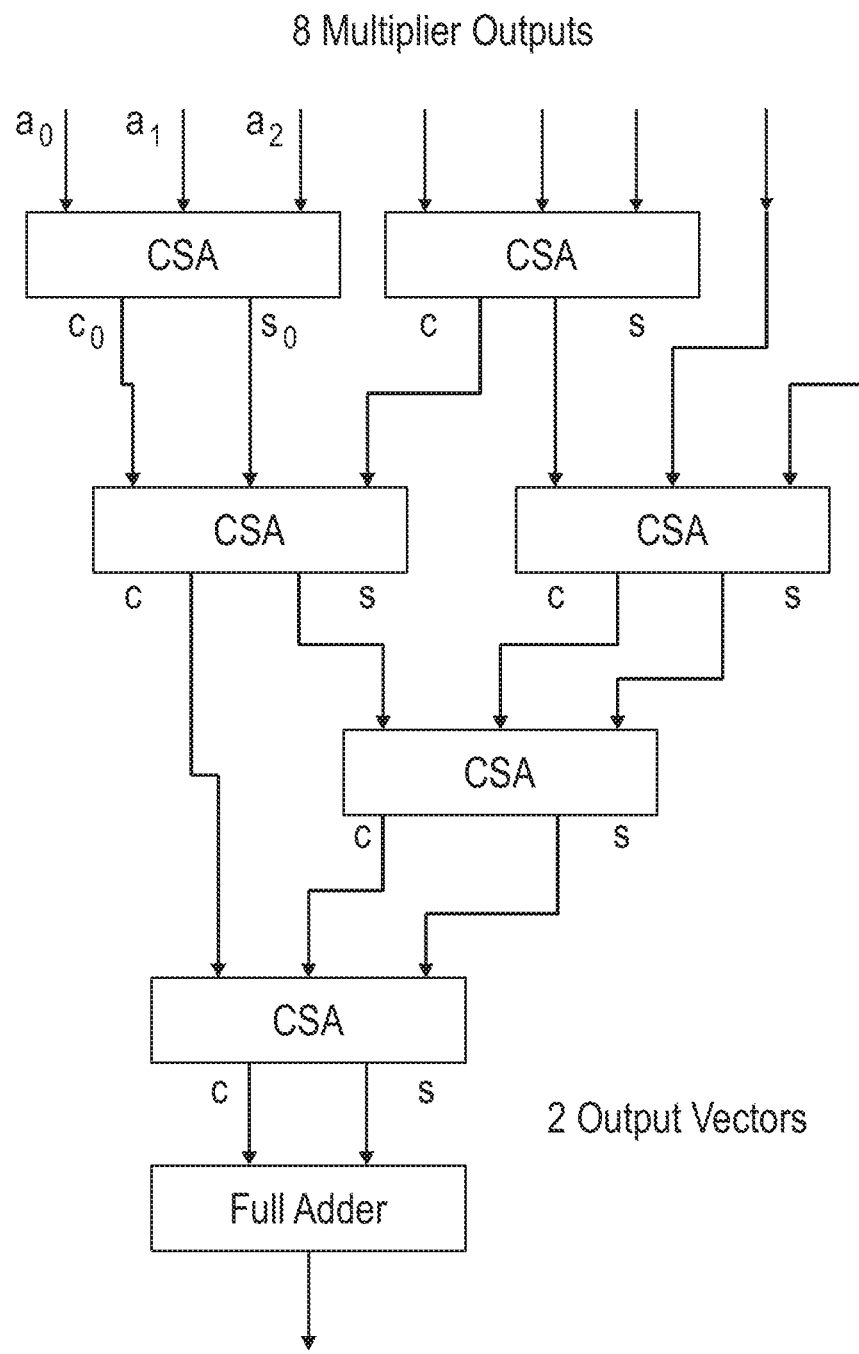
FIG. 9 depicts a tree of carry-save adders for a dendrite circuit, according to embodiments of the present disclosure.

In connection with the operation shown schematically in FIG. 9, an exemplary embodiment in which an adder tree is implemented with carry save adders is presented, in accordance with the present disclosure. Carry save adders are advantageous in that they have a short cycle time, take 3 inputs and produce 2 outputs whose sum is equal to the sum of inputs, and are used frequently in multiplier circuits. For example, if $s_0$ and $c_0$ are two outputs from CSA:

sum vector:$s_0 = CSA\text{-}S(a_0, a_1, a_2)$ carry vector:$c_0 = CSA\text{-}C(a_0, a_1, a_2)$ Then, $s_0 + c_0 = a_0 + a_1 + a_2$ In the exemplary embodiment shown, a Wallace adder tree is constructed with carry save adders, and output is two vectors whose sum is equal to the sum of all inputs. In order to obtain the final summation result, the two output vectors must be added by a normal adder one last time. There may be an additional CSA to add a previously calculated partial sum before performing the final addition. An advantage of this technique is that the run time is shorter than a simple adder tree.

In some embodiments, an n×m weight matrix W is employed with only {−1,0,1} as possible values. A ternary weight matrix with 4 bit neurons can achieve high accuracy with suitable training algorithms. An example 4×4 matrix is as follows:

$$W = \begin{pmatrix} 0 & -1 & 1 & 0 \\ 1 & 0 & -1 & 0 \\ 1 & 0 & 1 & -1 \\ 0 & 1 & 1 & 1 \end{pmatrix}$$

Figure 10A:
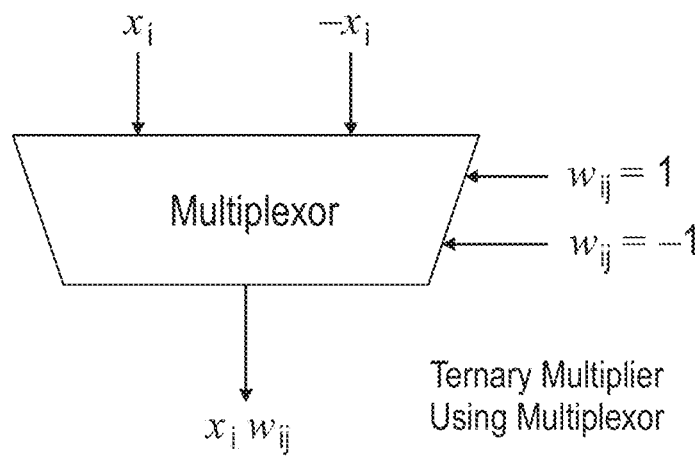
FIGS. 10A-B depict a ternary multiplier implemented by a multiplexor, according to embodiments of the present disclosure.
Figure 10B:
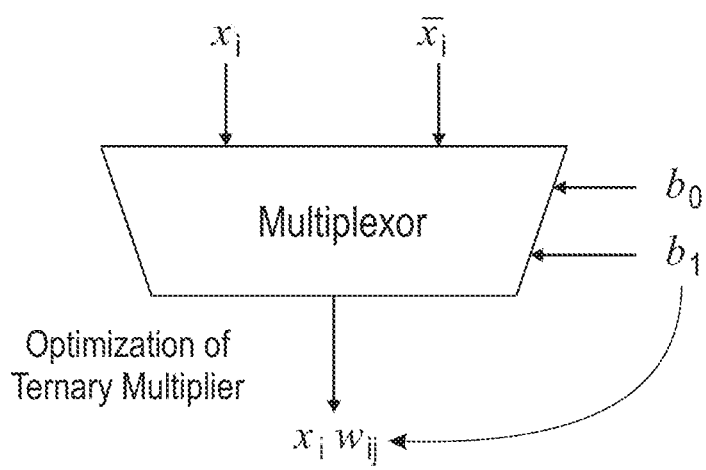

FIGS. 10A-B depict exemplary embodiments in which a ternary multiplier is implemented by a multiplexor, in accordance with the present disclosure. Here a multiplexor can be provided as a replacement for a multiplier when the weight is a ternary value: $w_{ij} \in \{-1, 0, 1\}$. The example shown outputs $x_i w_{ij}$ using a two way multiplexor.

Outputs $x_i$ when $w_{ij}=1$
Outputs $-x_i$ when $w_{ij}=-1$
If neither control signal is on, output is the default 0 value.

This can be optimized as follows, and as depicted in FIG. 10B: Use $\bar{x}_i$(one's complement of $x_i$) instead of $-x_i$(two's complement). Since $-x_i = \bar{x}_i + 1$, we need to add 1 at some other place. This 1 fits well if a CSA tree is employed for the adder tree, because CSA-C output of a CSA is shifted to the left by one. Additionally $w_{ij}$ may be represented by two bit representation [$b_1 b_0$]. (1:[01], 0:[00], −1 [10].) Then $b_0$ and $b_1$ can be used as an input to the multiplexor.

In accordance with another aspect of the disclosure, a weight matrix can be stored in a compressed format, and decoded on demand. Here, the ternary weight value can be compressed, because a ternary representation carries less information (than 2 binary bits). In some embodiments, an 8-bit binary can represent 5-ternary values. For example, a compressed 8-bit value ω is decoded into 5 ternary values $W_{0:4}$ using the equation below.

$w_0 = \omega \% \, 3 - 1$ $w_1 = (\omega/3) \% \, 3 - 1$ $w_2 = (\omega/9) \% \, 3 - 1$ $w_3 = (\omega/27) \% \, 3 - 1$ $w_4 = (\omega/81) \% \, 3 - 1$ Where a % b is the remainder from dividing a by b.

Just before performing vector-matrix multiplication, decoding of the compressed weight is performed. This leads to less storage and communication overhead (e.g., instead of 10-bits, only 8-bits are required to represent 5 ternary values). It will be appreciated that this exemplary compression algorithm is provided for illustration, and other compression algorithms may be employed for weight matrix compression. Additionally, sparse matrices may be compressed in order to achieve a better compression ratio.

Figure 11:
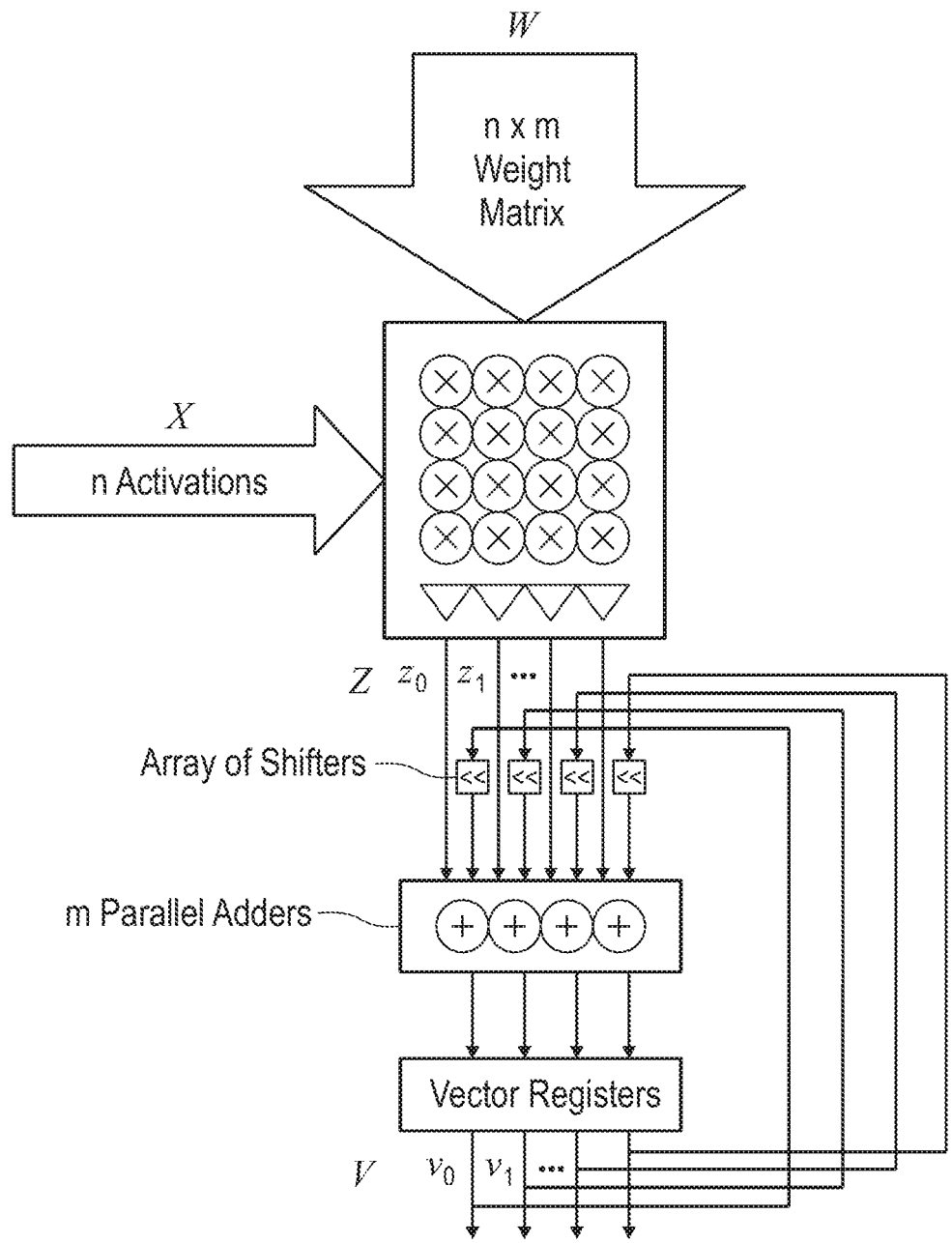
FIG. 11 depicts a shifter for use in vector-matrix multiplication, according to embodiments of the present disclosure.

FIG. 11 depicts an exemplary embodiment in which a shifter is employed to obtain higher precision vector-matrix multiplication, in accordance with the present disclosure. In some instances, it is desirable to use higher precision computation in evaluating a neural network. For example, input activation data may be represented by 8-bit values. An 8-bit activation value x can be represented by:

$x[7:0] = x_L + (x_M << 4)$ where $x_L$ is the least significant 4 bits,
and $x_M$ is the most significant 4 bits.

XW can be computed by iterating the vector-matrix multiplication, since:

$XW = X_L W + X_M W << 4$

The partial sum $V^{t-1} = X_L W$ is computed and shifted to the left by 4 bits, and added to the new partial sum $Z = X_M W$. An array of shifters, in the path from the partial sum registers to the adder arrays, can be employed to add shifted partial sums to the new vector-matrix multiplication result.

Accordingly, there are a number of vector matrix multipliers that apply multiply-add element by element, and compute sequentially. The present disclosure deals with low precision vector-multiply, for which a parallel architecture can be implemented to compute the entire vector-multiply all at once. Therefore, the novel parallel aspect of the present disclosure is particularly advantageous over the prior art techniques.

Figure 12:
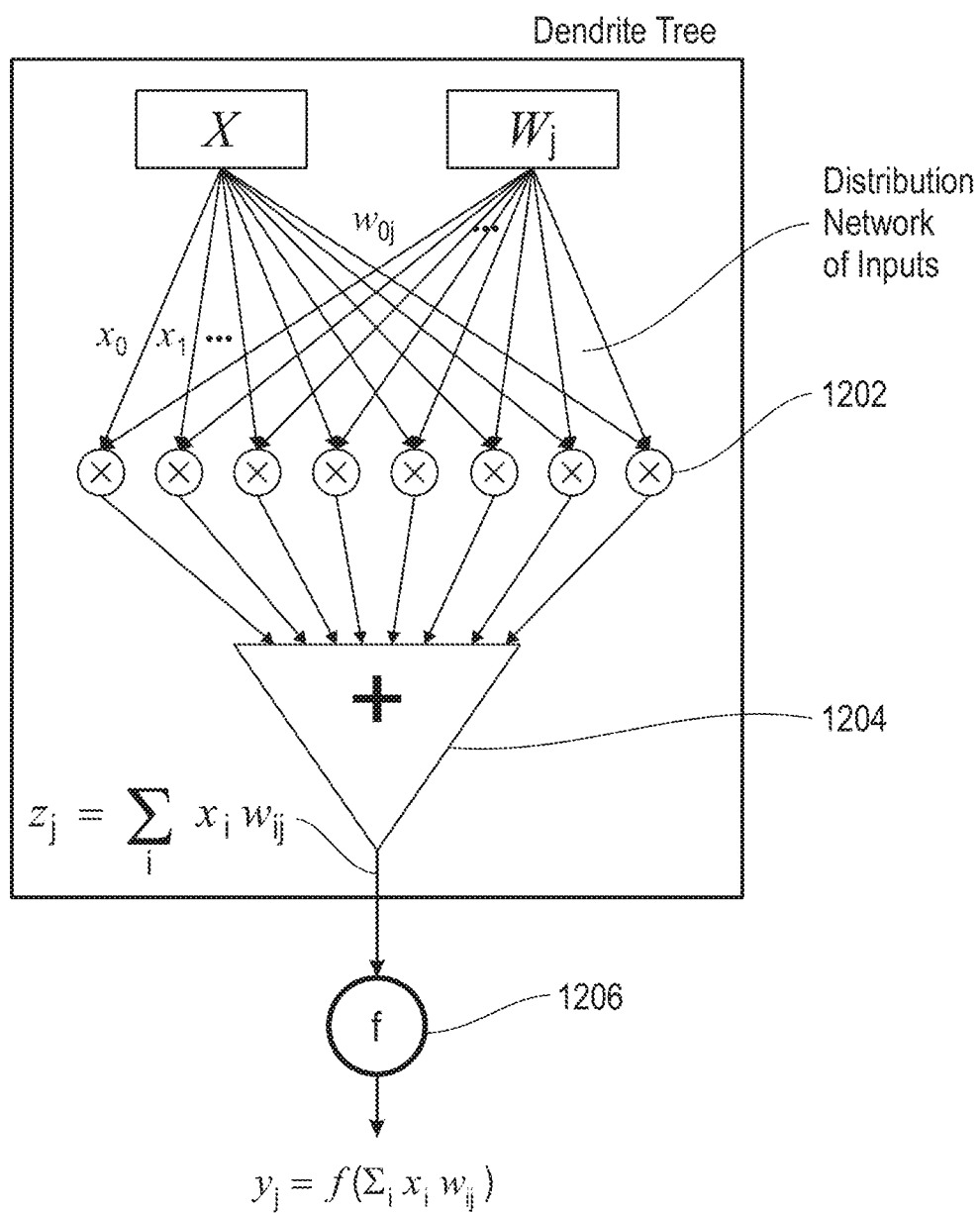
FIG. 12 depicts a neural circuit, according to embodiments of the present disclosure.

In various embodiments, the circuit depicted in FIG. 5 comprises m circuits, as depicted in FIG. 12. Particularly, the inputs, n-element vector X and $W_j$ ($j^{th}$ column of matrix W), are distributed to n multipliers 1202, which can be configured in a parallel orientation. Each multiplier computes a product, with the products being added into a single sum by the adder tree 1204. The output of the adder tree goes to the activation function 1206, producing the neuron activation. In some embodiments, this function is programmable and can be set to a non-linear or linear function, e.g., the identity function.

In accordance with an aspect of the disclosure, the systems and methods presented compute vector multiplication, which can be followed by a non-linear or linear activation function. In particular, the present disclosure provides for computation of neural activations. Additionally, the present disclosure provides for a "pooling" operation in neural networks (NN), which is essential and time consuming. Furthermore, the present disclosure provides for a data shuffling operation in neural network (NN) inference. These computations are achieved by extending the dendrite tree circuits described above.

Figure 13:
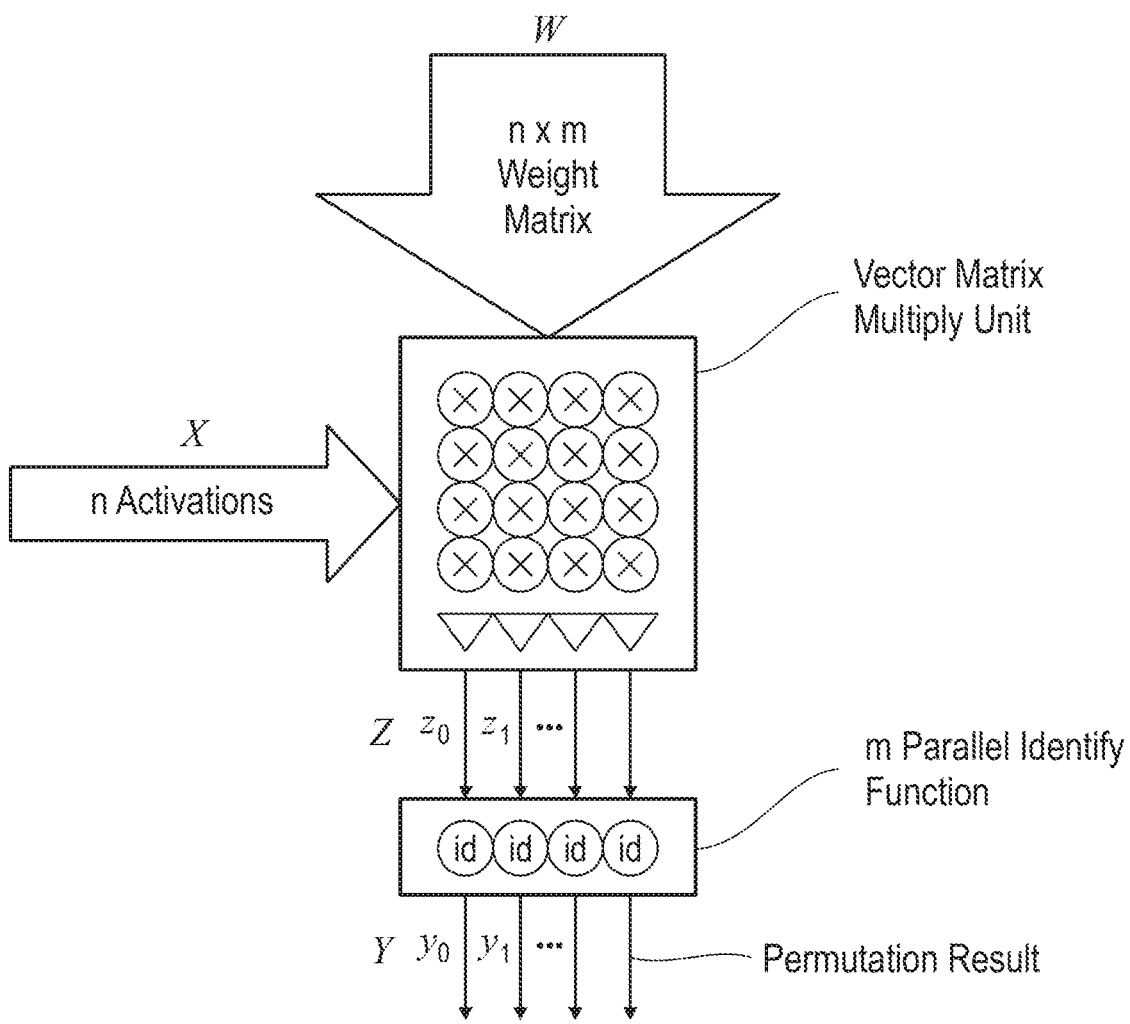
FIG. 13 depicts a shuffling operation using a vector matrix multiply unit, according to embodiments of the present disclosure.
Figure 14A:
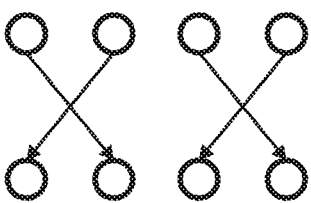
FIGS. 14A-B illustrate exemplary butterfly network computations according to embodiments of the present disclosure.
Figure 14B:
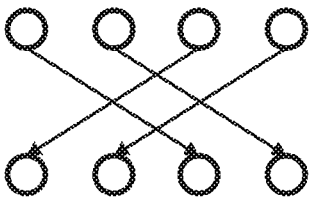

In connection with the operation shown schematically in FIG. 13, an exemplary data shuffling operation is depicted. For example, a butterfly permutation is provided as follows: For an input vector X=(0 1 2 3), the permuted output result is Y=(1 0 3 2). In some embodiments, a shuffling operation can be implemented by: setting the activation function to the identity function, (id(x)=x); setting the weight matrix W to be a permutation matrix. For instance, only one element in a row and column is 1, and all other elements are 0. An exemplary butterfly network implementation is illustrated in FIG. 14A. When the matrix-multiply operation is performed with the matrix W depicted in FIG. 14A, the input vector X=(0,1,2,3) is permuted into an output vector Y=(1,0,3,2). An exemplary butterfly network of degree 2 is illustrated in FIG. 14B. When the matrix multiplier operation is performed with the matrix W depicted in FIG. 14B, the input vector X=(0,1,2,3) is permuted into an output vector Y=(2, 3,0,1).

Figure 15:
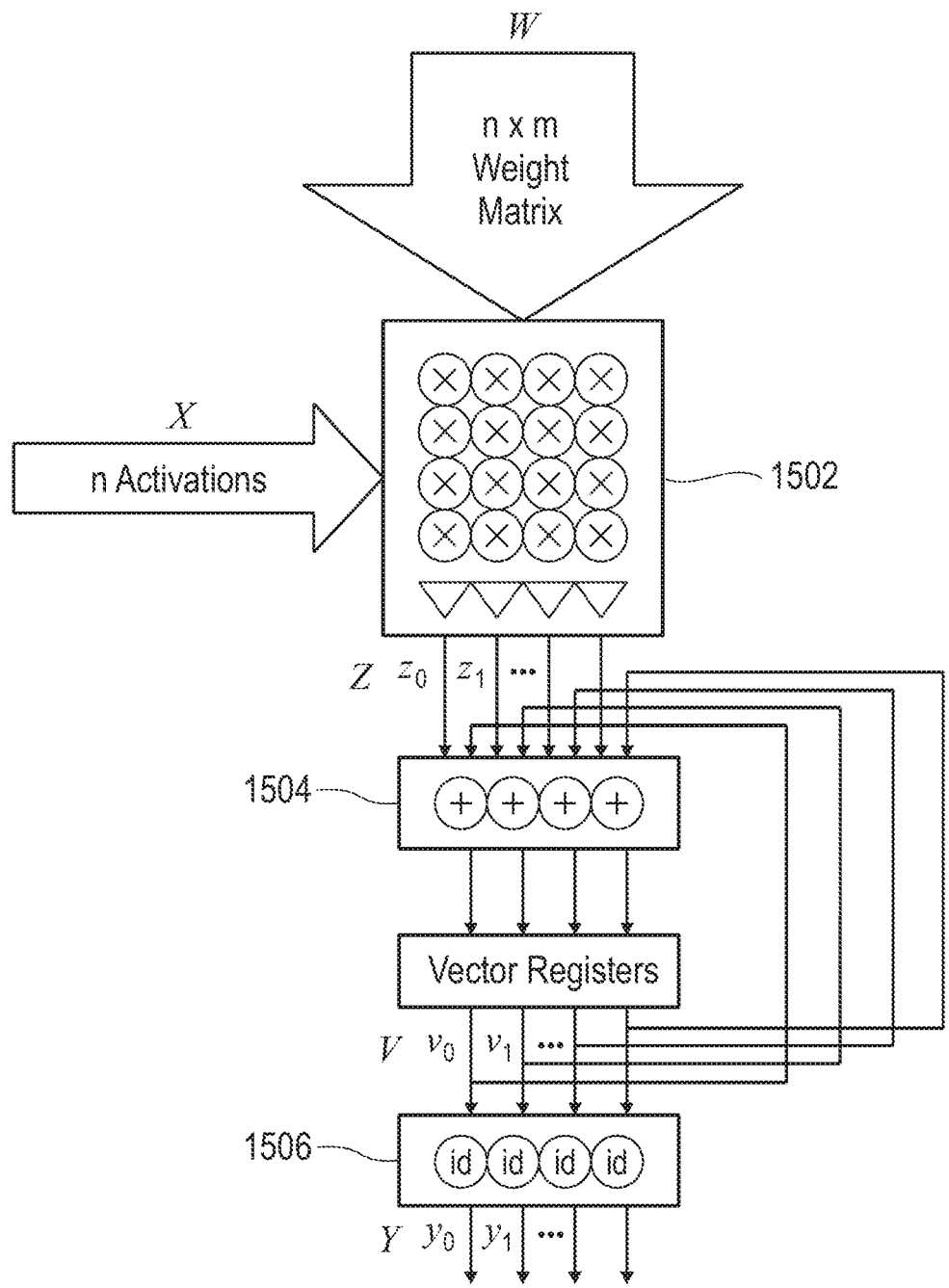
FIG. 15 depicts a data packing operation using a vector matrix multiply unit, according to embodiments of the present disclosure.

In connection with the operation shown schematically in FIG. 15, an exemplary embodiment in which data from multiple vectors is packed into a single vector is presented, in accordance with the present disclosure. This feature can be particularly useful for tensor down-sampling. For purpose of illustration and not limitation, vectors $X^A$=(0 1 2 3) and $X^B$=(4 5 6 7) are packed into a single vector Y=(0 2 4 6) by picking values alternatively. In this exemplary embodiment, the following vector matrix multiply unit 1502 is employed, with the activation function set to the identity function (id(x)=x).

First, perform: $Z=X^A W_0$, and V=Z+0

$$W_0 = \begin{pmatrix} 1 & 0 & 0 & 0 \\ 0 & 0 & 0 & 0 \\ 0 & 1 & 0 & 0 \\ 0 & 0 & 0 & 0 \end{pmatrix}$$

Second, perform $V=V+X^B W_1$ $$W_1 = \begin{pmatrix} 0 & 0 & 1 & 0 \\ 0 & 0 & 0 & 0 \\ 0 & 0 & 0 & 1 \\ 0 & 0 & 0 & 0 \end{pmatrix}$$

The vector register holds the previously computed partial sum ($V^1$). This partial sum is fed back to the array of adders 1504, which then adds the new partial sum ($X^B W_1$). The data flow, shown on the right of FIG. 15, consists of an array of adders, registers, feedback paths, and an array of activation functions 1506 set to the identity function.

Figure 16:
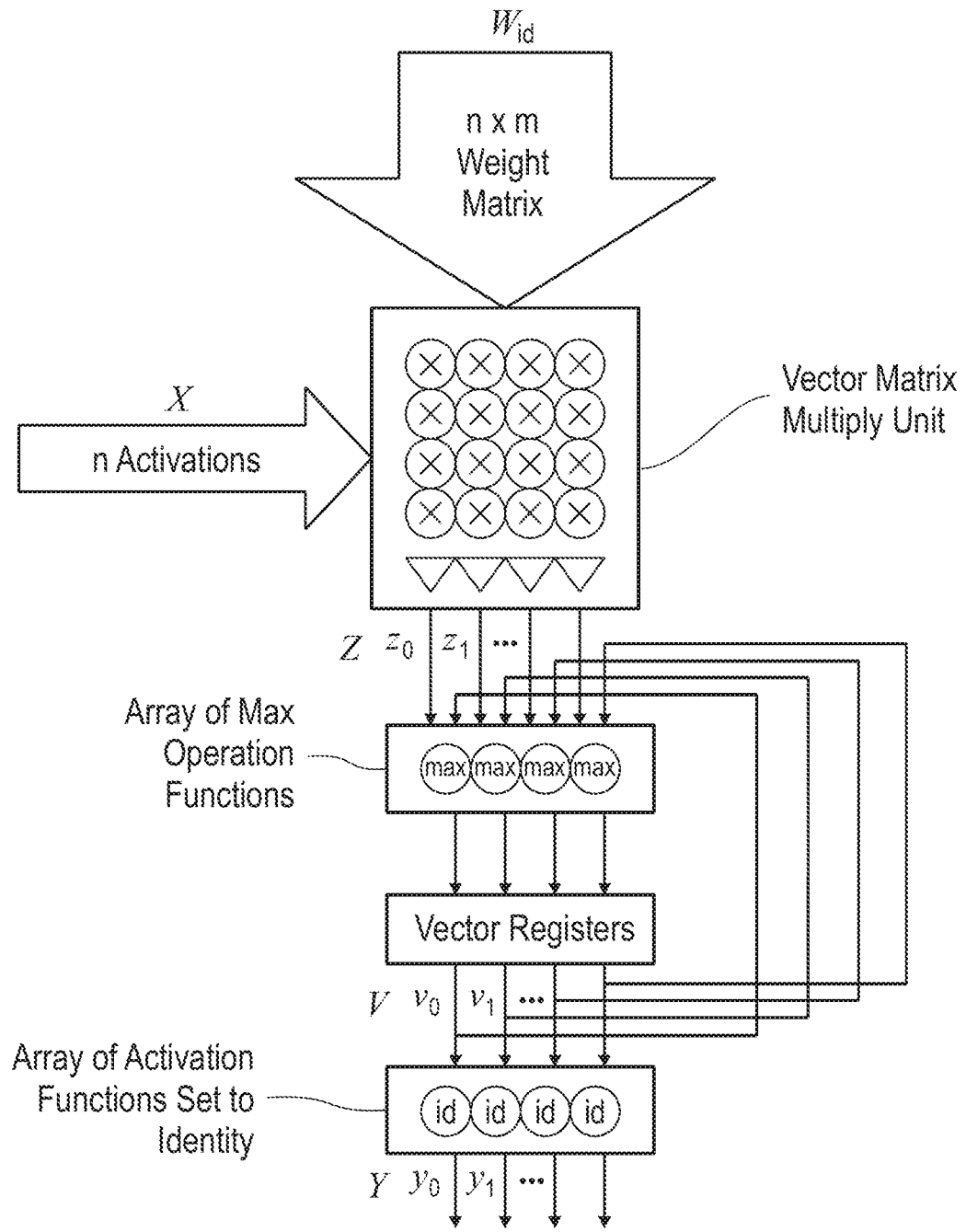
FIG. 16 depicts a max pooling operation using a vector matrix multiply unit, according to embodiments of the present disclosure.

In connection with the operation shown schematically in FIG. 16, an exemplary embodiment in which max pooling operations are performed using the vector matrix multiply unit is presented, in accordance with the present disclosure. This feature can be particularly useful in neural networks to reduce large images to smaller sizes. For purpose of illustration and not limitation, a 2×2 max pooling is performed on $X^A$=(0 3 2 1), $X^B$=(3 1 2 2), $X^C$=(4 0 1 0) and $X^D$=(0 1 4 0). In the exemplary embodiment depicted, an element-wise maximum is employed to get Y=(4 3 4 2). In this exemplary embodiment, the vector matrix multiply unit can be employed as follows:

Set the activation function to the identity function.
Use the identity matrix $$W_{id} = \begin{pmatrix} 1 & 0 & 0 & 0 \\ 0 & 1 & 0 & 0 \\ 0 & 0 & 1 & 0 \\ 0 & 0 & 0 & 1 \end{pmatrix}$$

Using the feedback path, combine the current partial sum (Z) with the previously computed partial sum (V) using the element-wise maximum value operation.

These operations may be described as follows:

$V=\max(X^A W_{id}, 0)$      1.

$V=\max(X^B W_{id}, V)$      2.

$V=\max(X^C W_{id}, V)$      3.

$V=\max(X^D W_{id}, V)$      4.

$Y=id(V^{n-1})$      5.

Figure 17:
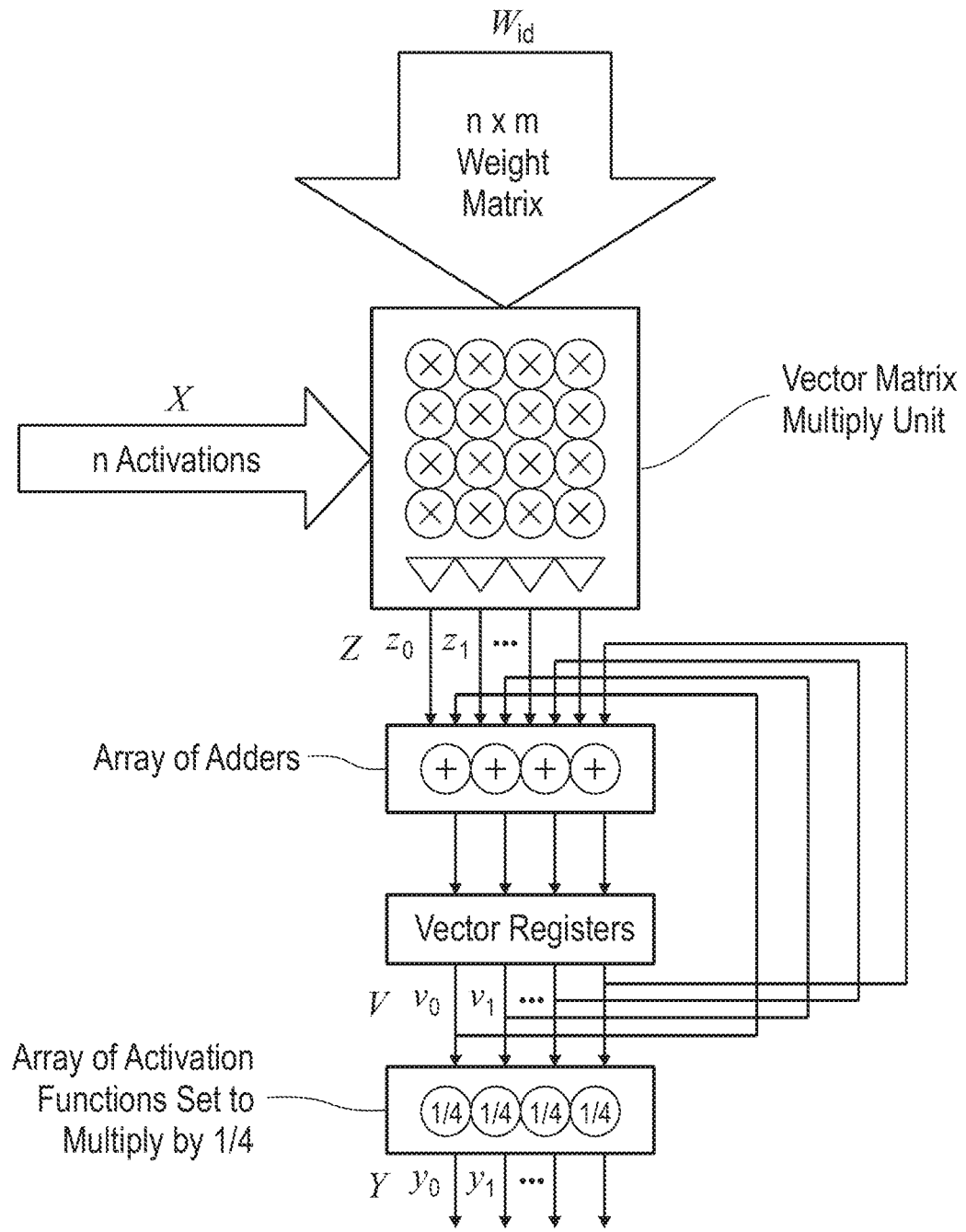
FIG. 17 depicts an average pooling operation using a vector matrix multiply unit, according to embodiments of the present disclosure.

In connection with the operation shown schematically in FIG. 17, an exemplary embodiment in which average pooling operations are performed using the vector matrix multiply unit is presented, in accordance with the present disclosure. This feature can also be particularly useful in neural networks to reduce large images to smaller sizes. For purpose of illustration and not limitation, a 2×2 average pooling is performed on $X^A$=(0 3 2 1), $X^B$=(3 1 2 2), $X^C$=(4 0 1 0) and $X^D$=(1 0 3 1). We take an element-wise average to get Y=(2 1 2 1). In this exemplary embodiment, the vector matrix multiply unit can be employed as follows:

Set the activation function to multiply by ¼
Use the identity matrix $W_{id}$
Using the feedback path, simply add the previously computed partial sum (V) to the new vector matrix product (Z=XW).

In formula, the following are performed:

$V=X^A W_{id}+0$      1.

$V=X^B W_{id}+V$      2.

$V=X^C W_{id}+V$      3.

$V=X^D W_{id}+V$      4.

$Y=(V*¼)$      5.

Figure 18:
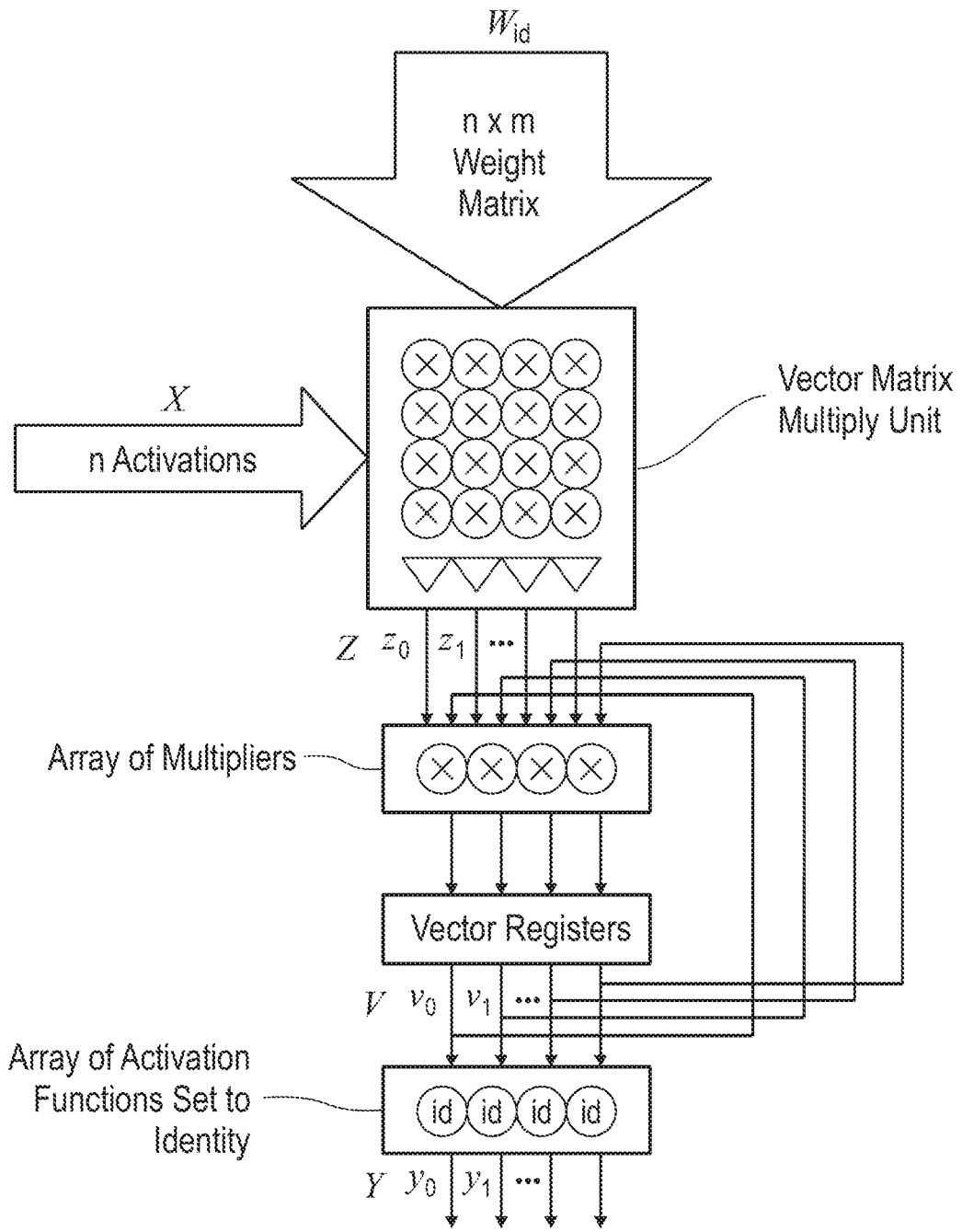
FIG. 18 depicts an element-wise multiply operation using a vector matrix multiply unit, according to embodiments of the present disclosure.

In connection with the operation shown schematically in FIG. 18, an exemplary embodiment in which element-wise multiply operations are performed using the vector matrix multiply unit is presented, in accordance with the present disclosure. This feature is critical in some neural networks, e.g., Long Short-Term Memory (LSTM). For purpose of illustration and not limitation, an element-wise multiply operation is performed on $X^A$=(0 3 2 1) and $X^B$=(3 1 2 2), which results in Y=(0 9 4 2). In this exemplary embodiment, the vector matrix multiply unit can be employed as follows:

Set the activation function to the identity function

Use the identity matrix $W_{id}$

Feedback is combined by an array of multiplier units to compute the product of previously computed partial sums (V) to the new vector matrix product (Z=XW).

In formula, the following are performed:

$$V = X^A W_{id} * 1 \qquad 1.$$

$$V = X^B W_{id} * V \qquad 2.$$

$$Y = id(V) \qquad 3.$$

Figure 19:
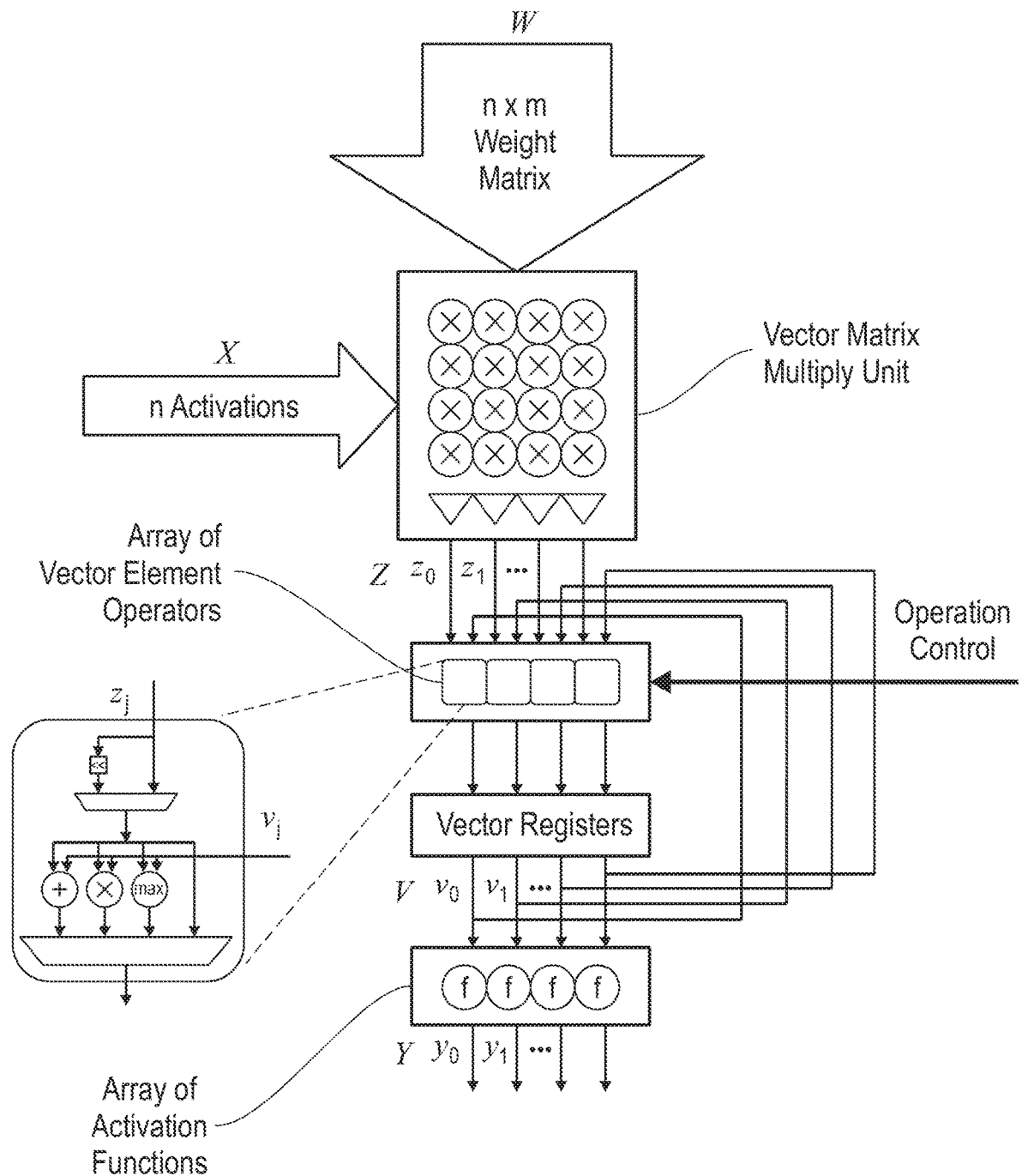
FIG. 19 depicts a programmable operation to combine partial sums with multiple element-wise operations using a vector matrix multiply unit, according to embodiments of the present disclosure.

In connection with the operation shown schematically in FIG. 19, an exemplary embodiment in which a programmable operation to combine previous partial sums with multiple element-wise operations is presented, in accordance with the present disclosure. For purpose of illustration and not limitation, the vector unit can perform element-wise functions, such as Add, Max, Multiply, Shift, Bypass. Additionally or alternatively, these functions can be provided in conjunction with a shift (on one input), including:

add(shift(A), B), max(shift(A), B), mult(shift(A), B), shift(A)

SIMD (Single Instruction, Multiple Data) operation

The same operation is applied to all inputs to the vector unit in parallel

Vector unit is programmable to perform any operation each cycle

Accordingly, the vector unit has multiple selectable element-wise operators, and the input path has selectable shift operator.

Accordingly, the present disclosure provides a device comprising a vector-matrix multiply unit with a programmable element-wise operators and element-wise shift operators. In some embodiments, the data logic is pipelined.

Figure 20:
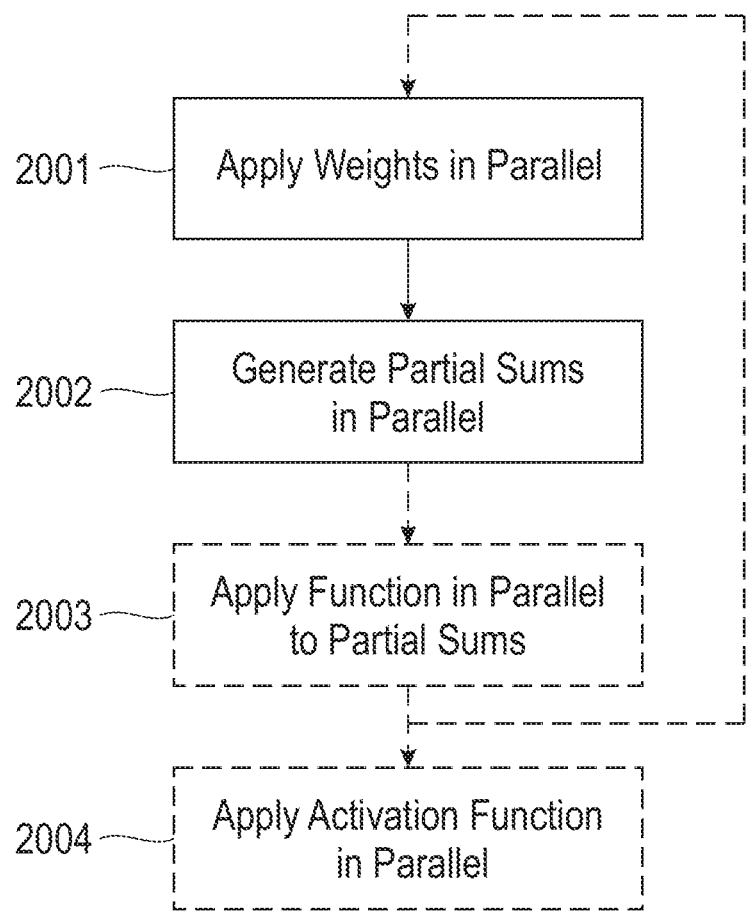
FIG. 20 depicts a method for operating a neural processing core according to embodiments of the present disclosure.

Referring to FIG. 20, a method for operating a neural processing core is illustrated according to embodiments of the present disclosure. At 2001, a plurality of equal-sized groups of multipliers, in parallel, apply a plurality of weights to a plurality of input activations to generate a plurality of outputs for each group of multipliers. At 2002, the plurality of outputs from each group of multipliers are added, in parallel, to generate a partial sum from each group of multipliers. In some embodiments, at 2003, a function is applied, in parallel, to the partial sums to generate a plurality of output values. In some embodiments, the function applied to the partial sums includes vector add, multiply, shift, and max operations, which are used to generate compound partial sums. As depicted, in some embodiments, additional partial sums may then be computed at 2001. At 2004, an activation function is applied, in parallel, to the partial sums to generate a plurality of output activations.

Figure 21:
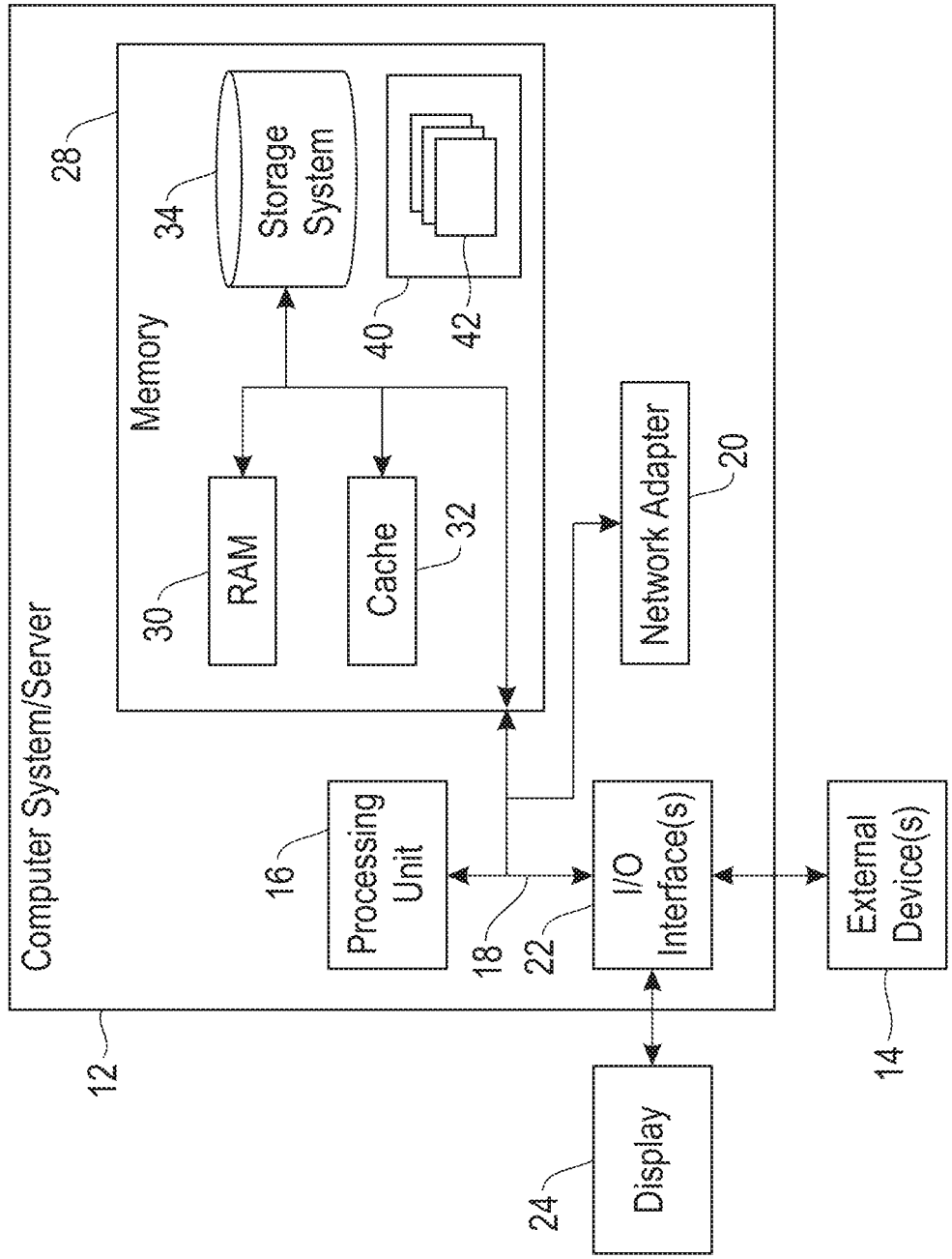
FIG. 21 depicts a computing node according to embodiments of the present disclosure.

Referring now to FIG. 21, a schematic of an example of a computing node is shown. Computing node 10 is only one example of a suitable computing node and is not intended to suggest any limitation as to the scope of use or functionality of embodiments described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 21, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, Peripheral Component Interconnect Express (PCIe), and Advanced Microcontroller Bus Architecture (AMBA).

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

In various embodiments, one or more neurosynaptic core (not pictured) is coupled to bus 18. In such embodiments, a neurosynaptic core may receive data from or write data to memory 28 via bus 18. Likewise, a neurosynaptic core may interact with other components via bus 18 as described herein. In various embodiments, a neurosynaptic core may include one or more local controller, memory, or clock, for example as set forth elsewhere herein.

The present disclosure may include a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   a plurality of multipliers, the plurality of multipliers arranged in a plurality of equal-sized groups, each of the plurality of multipliers being adapted to, in parallel, apply a weight to an input activation to generate an output;
   a plurality of adders, each of the plurality of adders being operatively coupled to one of the groups of multipliers, each of the plurality of adders being adapted to, in parallel, add the outputs of the multipliers within its associated group to generate a partial sum;
   a first plurality of function blocks, each of the first plurality of function blocks being operatively coupled to one of the plurality of adders, each of the first plurality of function blocks being adapted to, in parallel, apply a function to the partial sum of its associated adder to generate an output value;
   a vector register, the vector register being operatively coupled to the first plurality of function blocks, the vector register adapted to store the output values of the first plurality of function blocks;
   a second plurality of function blocks, each of the second plurality of function blocks being operatively coupled to the vector register, each of the second plurality of function blocks being adapted to, in parallel, apply a function to the stored output values.

2. The system of claim 1, adapted to receive a matrix of weights and a vector of activations.

3. The system of claim 1, wherein each of the plurality of adders comprises a tree of adders.

4. The system of claim 3, wherein the tree of adders is a binary tree.

5. The system of claim 3, wherein the tree of adders comprises a plurality of carry-save adders.

6. The system of claim 2, wherein each activation of the vector of activations is broadcast to all of the groups of multipliers.

7. The system of claim 2, further comprising a systolic pipeline operatively coupled to each of the groups of multipliers.

8. The system of claim 2, wherein the matrix of weights is compressed, and wherein the system is adapted to decompress the compressed matrix of weights.

9. The system of claim 1, wherein the groups of multipliers are pipelined.

10. The system of claim 1, wherein the weights are balanced ternary values.

11. The system of claim 1, wherein each of the plurality of multipliers comprises a multiplexor.

12. The system of claim 1, wherein the first plurality of function blocks are adapted to combine the output values with subsequently computed output values.

13. The system of claim 1, further comprising:
   a plurality of shifters, each shifter operatively connected to one of the first plurality of function blocks, each shifter adapted to, in parallel, shift the output value of its corresponding function block, and wherein
      the first plurality of function blocks are adapted to combine the shifted values with subsequently computed output values.

14. The system of claim 1, wherein the function of each of the first plurality of function blocks is an activation function.

15. The system of claim 1, wherein the function of each of the first plurality of function blocks is programmable.

16. The system of claim 1, wherein the function of each of the first plurality of function blocks is addition.

17. The system of claim 1, wherein the function of each of the first plurality of function blocks is multiplication.

18. The system of claim 1, wherein the function of each of the first plurality of function blocks is an identity function.

19. The system of claim 1, further comprising a lookup table, the function of each of the first plurality of function blocks comprising a lookup from the lookup table.

20. The system of claim 19, wherein the lookup table is programmable.

21. The system of claim 1, wherein the function of each of the first plurality of function blocks is a max function.

22. The system of claim 1, wherein the function of each of the first plurality of function blocks is a min function.

23. The system of claim 1, wherein the function of each of the second plurality of function blocks is the identity function.

24. The system of claim 1, wherein the function of each of the second plurality of function blocks is an activation function.

25. The system of claim 1, adapted to perform a permute operation.

26. The system of claim 1, adapted to perform a vector packing operation.

27. The system of claim 1, adapted to perform a max-pooling operation.

28. The system of claim 1, adapted to perform an average-pooling operation.

29. The system of claim 1, adapted to perform an element-wise multiply operation.

30. A method comprising:
   applying by a plurality of equal-sized groups of multipliers, in parallel, a plurality of weights to a plurality of input activations to generate a plurality of outputs for each group of multipliers;
   adding, in parallel, the plurality of outputs from each group of multipliers to generate a partial sum from each group of multipliers;
   applying, in parallel, a function to the partial sums to generate a plurality of output values;
   storing the plurality of output values; and
   applying, in parallel, a function to the stored output values.

31. The method of claim 30, further comprising:
   shifting, in parallel, the output value of each of the first plurality function blocks; and
   combining the shifted values with subsequently computed output values.

32. A system comprising:
   a plurality of multipliers, the plurality of multipliers arranged in a plurality of equal-sized groups;
   a plurality of adders, each of the plurality of adders being operatively coupled to one of the groups of multipliers;
   a first plurality of function blocks, each of the first plurality of function blocks being operatively coupled to one of the plurality of adders;
   a vector register, the vector register being operatively coupled to the first plurality of function blocks;
   a second plurality of function blocks, each of the second plurality of function blocks being operatively coupled to the vector register; and
   a computer readable storage medium having program instructions embodied therewith, the program instructions executable to perform a method comprising:
      by each of the plurality of multipliers, in parallel, applying a weight to an input activation to generate an output;
      by each of the plurality of adders, in parallel, adding the outputs of the multipliers within its associated group to generate a partial sum;
      by each of the plurality of function blocks, in parallel, applying a function to the partial sum of its associated adder to generate an output value;
      by the vector register, storing the output values of the first plurality of function blocks; and
      by each of the second plurality of function blocks, in parallel, applying a function to the stored output values.

33. The system of claim 32, further comprising:
   a plurality of shifters, each shifter operatively connected to one of the first plurality of function blocks, wherein the method further comprises:
      by each shifter, in parallel, shifting the output value of its corresponding function block;
      by the first plurality of function blocks, combining the shifted values with subsequently computed output values.

* * * * *